US007043380B2

(12) United States Patent
Rodenberg, III et al.

(10) Patent No.: US 7,043,380 B2
(45) Date of Patent: May 9, 2006

(54) PROGRAMMABLE ELECTRICITY CONSUMPTION MONITORING SYSTEM AND METHOD

(76) Inventors: Ernest Adolph Rodenberg, III, 781 Bradburn Dr., Mt. Pleasant, SC (US) 29464; Robert Richard Borden, P.O. Box 12332, Buzzard's Roost Marina, 2408 Maybank Hwy., Charleston, SC (US) 29422

( * ) Notice: Subject to any disclaimer, the term of this patent is extended or adjusted under 35 U.S.C. 154(b) by 142 days.

(21) Appl. No.: 10/663,313

(22) Filed: Sep. 16, 2003

(65) Prior Publication Data

US 2005/0060107 A1 Mar. 17, 2005

(51) Int. Cl.
*G01R 21/00* (2006.01)
*H04M 11/04* (2006.01)

(52) U.S. Cl. .................. 702/62; 702/61; 340/310.01

(58) Field of Classification Search .................. 702/62, 702/57, 58, 59, 60, 61; 340/178, 870.02, 340/538, 310.01; 324/103, 142; 364/483, 364/464.04
See application file for complete search history.

(56) References Cited

U.S. PATENT DOCUMENTS

| 750,525 A | 1/1904 | Everest |
| 2,953,757 A | 9/1960 | Yarrick et al. |
| 3,056,922 A | 10/1962 | Du Vall et al. |

(Continued)

FOREIGN PATENT DOCUMENTS

| JP | 07-2299335 | 8/1995 |
| JP | 09053954 A | 2/1997 |
| JP | 2000314752 A | 11/2000 |
| WO | WO 02/084309 | 10/2002 |

OTHER PUBLICATIONS

Copending International application—PCT/US2004/017095, Notification of Transmittal of the International Search Report and the Written Opinion of the International. Searching Authority, or the Declaration, Europe.

*Primary Examiner*—John Barlow
*Assistant Examiner*—Meagan S Walling
(74) *Attorney, Agent, or Firm*—Harleston Law FirmLLC; Kathleen M. Harleston

(57) ABSTRACT

A programmable system for monitoring electricity consumption by a residence or business, including:
(a) a Measuring Transmitting Unit integrated in a main circuit breaker or utility meter in the residence or business; comprising: (1) a means of receiving AC analog signals, converting the AC analog signals to DC analog signals, summing the DC analog signals, and outputting the information; (2) a microcontroller; (3) a power line carrier transmission interface controller; and (4) a power supply for powering the Measuring Transmitting Unit; and
(b) a programmable Receiving Display Unit, comprising: (1) a power supply for powering the Receiving Display Unit; (2) a power plug; (3) a power line carrier transmission interface controller; (4) a data decoder; (5) a microcontroller; (6) memory associated with the microcontroller; (7) a visual display; and (8) a mechanism for inputting to the Receiving Display Unit; and
wherein the Measuring Transmitting Unit translates current to digitally encoded signals, and transmits the signals over existing power circuits in the residence or business; and the Receiving Display Unit receives the signals, decodes them, and translates them for viewing. A method for monitoring electricity consumption by a residence or business is also included.

34 Claims, 18 Drawing Sheets

U.S. PATENT DOCUMENTS

| | | |
|---|---|---|
| 3,323,056 A | 5/1967 | Haley |
| 3,984,798 A | 10/1976 | Bussen |
| 4,005,380 A | 1/1977 | Heilmann et al. |
| 4,120,031 A | 10/1978 | Kincheloe et al. |
| 4,147,978 A | 4/1979 | Hicks |
| 4,160,950 A | 7/1979 | Houldsworth |
| 4,207,557 A | 6/1980 | Gilkeson et al. |
| 4,286,213 A | 8/1981 | Fowler |
| 4,314,200 A | 2/1982 | Marek |
| 4,399,510 A | 8/1983 | Hicks |
| 4,401,943 A | 8/1983 | Morris |
| 4,442,492 A | 4/1984 | Karlsson et al. |
| 4,518,913 A | 5/1985 | Jackson |
| 4,630,211 A | 12/1986 | Pettis |
| 4,656,874 A | 4/1987 | Kulig |
| 4,697,182 A | 9/1987 | Swanson |
| 4,701,698 A | 10/1987 | Karlsson et al. |
| 4,716,409 A | 12/1987 | Hart et al. |
| 4,717,872 A | 1/1988 | Wagner et al. |
| 4,751,495 A | 6/1988 | Whitman |
| 4,760,334 A | 7/1988 | Crowell et al. |
| 4,803,632 A | 2/1989 | Frew et al. |
| 4,899,131 A | 2/1990 | Wilk et al. |
| 4,901,007 A | 2/1990 | Sworm |
| 4,904,995 A | 2/1990 | Bonner et al. |
| 4,940,976 A | 7/1990 | Gastouniotis et al. |
| 4,977,368 A | 12/1990 | Munday et al. |
| 5,128,611 A | 7/1992 | Konrad |
| 5,136,514 A | 8/1992 | Laumann |
| 5,153,837 A | 10/1992 | Shaffer et al. |
| 5,216,357 A | 6/1993 | Coppola et al. |
| D343,803 S | 2/1994 | Ouellette et al. |
| 5,287,287 A | 2/1994 | Chamberlain et al. |
| 5,315,531 A | 5/1994 | Oravetz et al. |
| 5,396,168 A | 3/1995 | Heep et al. |
| 5,430,430 A | 7/1995 | Gilbert |
| 5,446,370 A | 8/1995 | Voight |
| 5,451,923 A | 9/1995 | Seberger et al. |
| 5,548,527 A | 8/1996 | Hemminger et al. |
| 5,555,508 A | 9/1996 | Munday et al. |
| 5,559,894 A | 9/1996 | Lubliner et al. |
| 5,631,843 A | 5/1997 | Munday et al. |
| 5,635,895 A | 6/1997 | Murr |
| 5,737,730 A | 4/1998 | Alvarenga et al. |
| 6,150,955 A | 11/2000 | Tracy et al. |
| 6,226,600 B1 | 5/2001 | Rodenberg, III et al. |
| 2003/0050737 A1 | 3/2003 | Osann, Jr. |

PROGRAMMABLE ELECTRICITY CONSUMPTION MONITORING SYSTEM AND METHOD

BACKGROUND OF THE INVENTION

1. Technical Field

The present invention refers to a system and method for monitoring energy usage, preferably a system for continuously measuring and displaying electrical power consumption and cost at a consumer's residence or business.

2. Background Information

Our society recognizes its dependence upon electricity for day to day living, as well as the need to develop alternate forms of energy. Reducing power consumption, though advantageous for the public as a whole as well as the private individual, is difficult for the average consumer. The average consumer only receives feedback regarding power consumption upon receipt of a monthly bill from the power company.

A need exists for a practical, programmable, user friendly, affordable, portable system for continuous, contemporaneous monitoring of power consumption; a system that is integral with a main circuit breaker or utility meter and can easily be installed by a contractor or builder in the residence or business and easily understood by the consumer. In general, standard methods of measuring electrical power are known, as are systems for transmitting data through power line carrier transmission technology.

The present invention provides continuous, contemporaneous feedback concerning power usage and cost in the consumer's residence or place of business. The present electricity consumption monitoring system includes a Measuring Transmitting Unit, which is integral with a main circuit breaker or utility meter installed at the residence or business, and a separate Receiving Display Unit, which is plugged into any wall receptacle inside the residence or business. The Measuring Transmitting Unit encodes and transmits digitally encoded signals over existing power circuits within the home or business. The Receiving Display Unit decodes the signals and translates them to an easy-to-read display. This programmable electrical monitoring system monitors power usage and translates power usage into dollars and cents so that it is understandable to the average consumer. Feedback to the consumer is contemporaneous with each action by the consumer, e.g. turning on an overhead light in a room. The consumer can use this system to conserve electricity and reduce the power bill. This monitoring system uses power line carrier transmission technology to transmit information from the Measuring Transmitting Unit to the Receiving Display Unit. Thus, no additional wiring is required within the consumer's premises.

BRIEF SUMMARY OF THE INVENTION

The present invention is a programmable system for monitoring electricity consumption by a residence or business, including:
(a) a Measuring Transmitting Unit integrated in a main circuit breaker or utility meter in the residence or business; comprising: (1) a means of receiving AC analog signals, converting the AC analog signals to DC analog signals, summing the DC analog signals, and outputting the information; (2) a microcontroller; (3) a power line carrier transmission interface controller; and (4) a power supply for powering the Measuring Transmitting Unit; and
(b) a programmable Receiving Display Unit, comprising: (1) a power supply for powering the Receiving Display Unit; (2) a power plug; (3) a power line carrier transmission interface controller; (4) a data decoder; (5) a microcontroller; (6) memory associated with the microcontroller; (7) a visual display; and (8) a mechanism for inputting to the Receiving Display Unit; and
wherein the Measuring Transmitting Unit translates current flowing in main service power circuit conductors to digitally encoded signals, and transmits the digitally encoded signals over existing power circuits in the residence or business; and
wherein the Receiving Display Unit receives the digitally encoded signals being emitted by the Measuring Transmitting Unit, decodes the digitally encoded signals, and translates them to the visual display for viewing. A method for monitoring energy consumption by a residence or business is also included.

With the Measuring Transmitting Unit built into the main circuit breaker, the builder/contractor in a new installation can provide a circuit breaker panel with a main circuit breaker that already includes a complete MTU. Alternatively, a utility contractor can install a utility meter with an integrated MTU component in a new or existing residence or business. Thus, a consumer need only plug in and program a Receiving Display Unit to complete the Electricity Consumption Monitoring System installation. This Measuring Transmitting Unit embodiment does not require connection to a branch circuit breaker in order to provide power to the Measuring Transmitting Unit and a connection to the residence or building power circuits, for Power Line Carrier Transmission.

The Receiving Display Unit can also be linked to one or more load shedding devices using power line carrier technology connections via existing power lines. The load shedding device is then connected to at least one household or business appliance or energy consuming device in the residence or business. The load shedding device may be activated directly from the Receiving Display Unit, or via a personal computer, Personal Digital Assistant, telephone, pager, cell phone, or Internet signal.

The present invention also includes a method for monitoring electricity consumption by a residence or business, including the following steps:
(a) measuring current in main service power conductors, and converting the measurements to digital signals;
(b) encoding the digital signals and transmitting them over existing power lines in the residence or business using power line carrier technology;
(c) receiving the encoded digital signals from the power lines, decoding the encoded digital signals, and converting, preferably by performing mathematical operations, the decoded digital signals to power measurements, preferably in kilowatts, kilowatt hours, or currency units;
(d) periodically receiving signals from a utility;
(e) storing the measurements and utility signal information in memory; and
(f) displaying the information for viewing, preferably on a visual display.

BRIEF DESCRIPTION OF THE SEVERAL VIEWS OF THE DRAWINGS

A more complete understanding of the invention and its advantages will be apparent from the following detailed description taken in conjunction with the accompanying drawings, wherein examples of the invention are shown, and wherein.

DETAILED DESCRIPTION OF THE INVENTION

Figure 1:
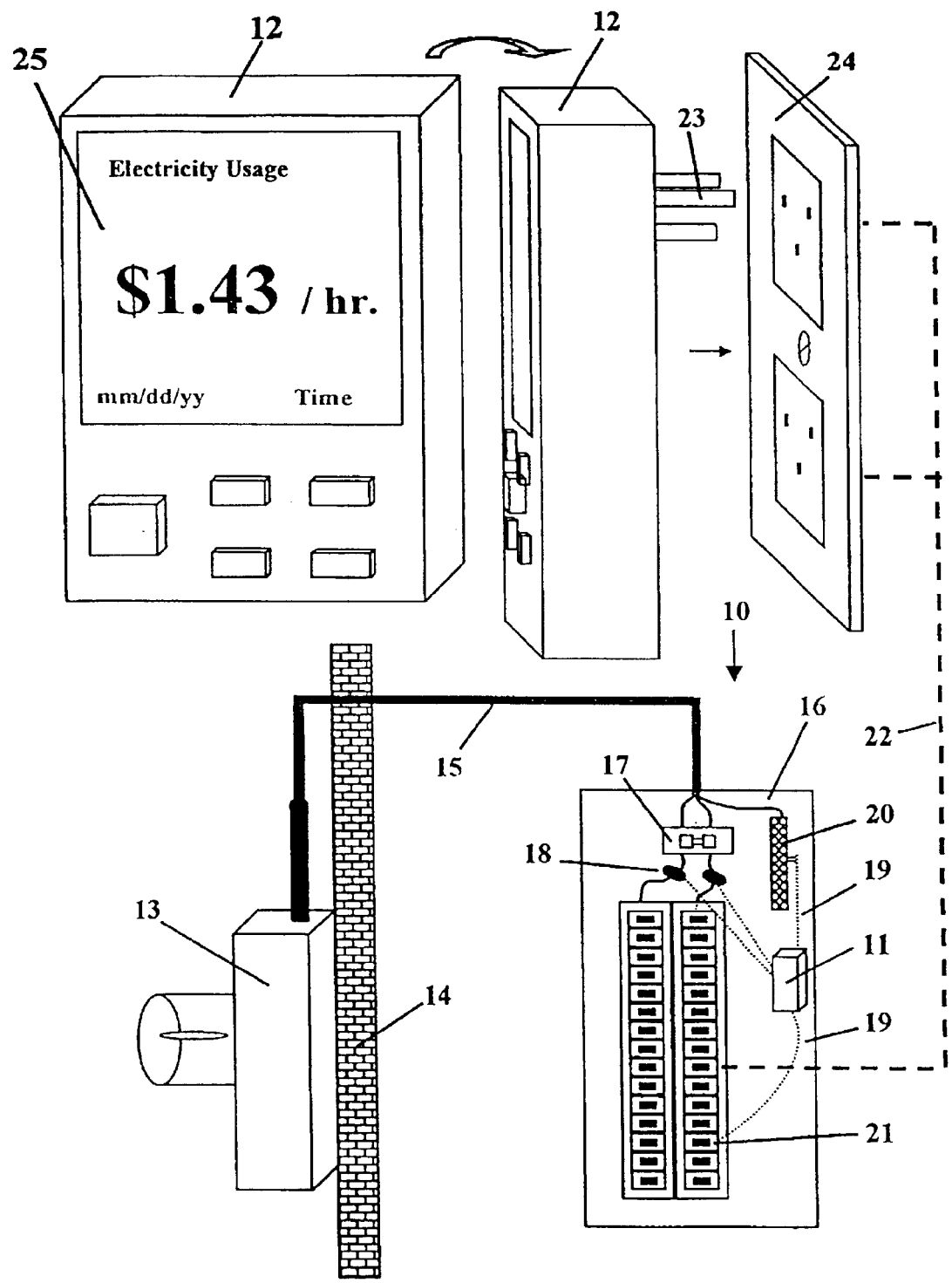
FIG. 1 shows a perspective view of an electricity consumption monitoring system according to the present invention, which includes a Measuring Transmitting Unit and a Receiving Display Unit.

In the following description, like reference characters designate like or corresponding parts throughout the several views. Also, in the following description, it is to be understood that such terms as "front," "back," "within," and the like are words of convenience and are not to be construed as limiting terms. Referring in more detail to the drawings, the invention will now be described.

Referring to FIG. 1, a programmable electricity monitoring system 10 according to the present invention comprises a Measuring Transmitting Unit (MTU) 11 and a Receiving Display Unit (RDU) 12.

The Measuring Transmitting Unit 11 is shown at the bottom of FIG. 1. On the left of FIG. 1, a utility KWH (kilowatt hour) meter 13 is shown on an exterior wall 14 of a residence or business. KWH meters are usually installed by power companies on the outside of buildings of their customers to measure power consumption by each customer. A main service power circuit 15 extends from the KWH meter 13 to a main circuit breaker panel 16 (sometimes called a fuse box) of the residence or other building.

FIG. 1 includes a view of the front of the circuit breaker panel 16. At the top of the circuit breaker panel 16 is a main breaker 17. The main breaker can also be a fused switch and is sometimes located in a separate enclosure, either inside or outside the building. For the purpose of this explanation, we will assume there is a main breaker forming part of the circuit breaker panel as shown in FIG. 1. The Measuring Transmitting Unit 11 (MTU) is shown at the right hand side of the circuit breaker panel 16 in the embodiment of FIG. 1. The Measuring Transmitting Unit 11 is connected to the main service power circuit 15 after or before the main breaker 17 via current transformers (CTs) 18 in the embodiment of FIG. 1. Preferably, each current transformer includes an integral burden resistor, or is permanently wired to a burden resistor in the Measuring Transmitting Unit, to preclude the possibility of large open circuit voltages associated with open circuit current transformers. The signals sent to the Measuring Transmitting Unit are therefore analog low voltage signals proportional to the amperage flowing through each of the main service power wires. In a single phase three wire system, which is common in most residences, there are two current transformers. In the three phase system typical in businesses, there are three current transformers. The Measuring Transmitting Unit 11 is also connected via external wires 19 to any 15 or 20 amp circuit breaker 21 and the neutral bus bar 20 to provide power to the Measuring Transmitting Unit and a connection to the residence or building power circuits. Individual circuit breakers 21 are shown below the main breaker 17 in FIG. 1. The Measuring Transmitting Unit sums the analog signals, performs an analog-to-digital conversion, and then encodes the digital signal and transmits the encoded signal over existing power wiring 22 within the home or other building using power line carrier transmission technology. Once installed, the Measuring Transmitting Unit 11 will function indefinitely until removed. The Measuring Transmitting Unit 11 is small, and is preferably enclosed by a protective cover. Its small size is beneficial in that it is easily installed.

The Measuring Transmitting Unit 11 is easy to install. In the embodiment of FIG. 1, once the circuit breaker panel cover is removed, the current transformers 18 are clipped over the main service power wires and the external wires 19 are connected to the neutral bus bar 20 and an individual circuit breaker 21. The service size selector switch is set to match consumer's service size.

At the top of FIG. 1, front and side perspective views of a Receiving Display Unit 12 are provided. On the back of the Receiving Display Unit 12 (see side view in FIG. 1) is a power plug 23. The user simply plugs the Receiving Display Unit 12 into any standard AC wall receptacle 24 in any room in the residence or business. Once the Receiving Display Unit 12 is plugged in, it will commence receiving the digitally encoded signals being emitted over existing power circuits by the Measuring Transmitting Unit 11. The Receiving Display Unit 12 receives and decodes the signals, processes the information through a microcontroller and then displays the information on a liquid crystal display (LCD) 25, on the face of the Receiving Display Unit 12. The user need not activate the display to receive the digital information; it is a continuous feed. When the user desires information, he or she simply observes the LCD display 25. The unit will ideally display KW (kilowatt) demand and KWH (kilowatt hour) usage, cost consumption, historical data and other information, as well as graphical representations of the information. The user can advance through the information displayed by use of the mode buttons.

For any of the embodiments described herein, the user can leave the Receiving Display Unit 12 in one wall receptacle 24, or it can be moved to a wall receptacle in another room. It is portable, and can be viewed at the user's convenience. Both the Receiving Display Unit 12 and the Measuring Transmitting Unit 11 can easily be removed and reconnected in a different residence or business, such as a relative's home or when the homeowner moves. The Receiving Display Unit has non-volatile memory so that all measured and programmed data survives when the Receiving Display Unit 12 is unplugged and moved, or during electricity outages. Data will not have been gathered for the period the unit is off-line. For this reason it is most desirable to minimize movement of the RDU and leave it plugged into one receptacle.

For any of the embodiments described herein, the Receiving Display Unit preferably comprises a built in alarm that is user-configured for any demand, or any not-to-exceed value of KWH or "dollars per hour" the user desires. An alarm gets the attention of anyone in the vicinity when a preset level has been reached. The user can program the alarm level, and can change the setting as often as one chooses. The user may wish to locate the Receiving Display Unit in a room that is often frequented, such as the kitchen, den, or bedroom, so that the display can easily be viewed and the alarm easily noticed.

An obvious benefit of the present system is the conservation of electricity and lower electricity bills. The system reduces electricity from some vague concept to an observable quantity.

Figure 2:
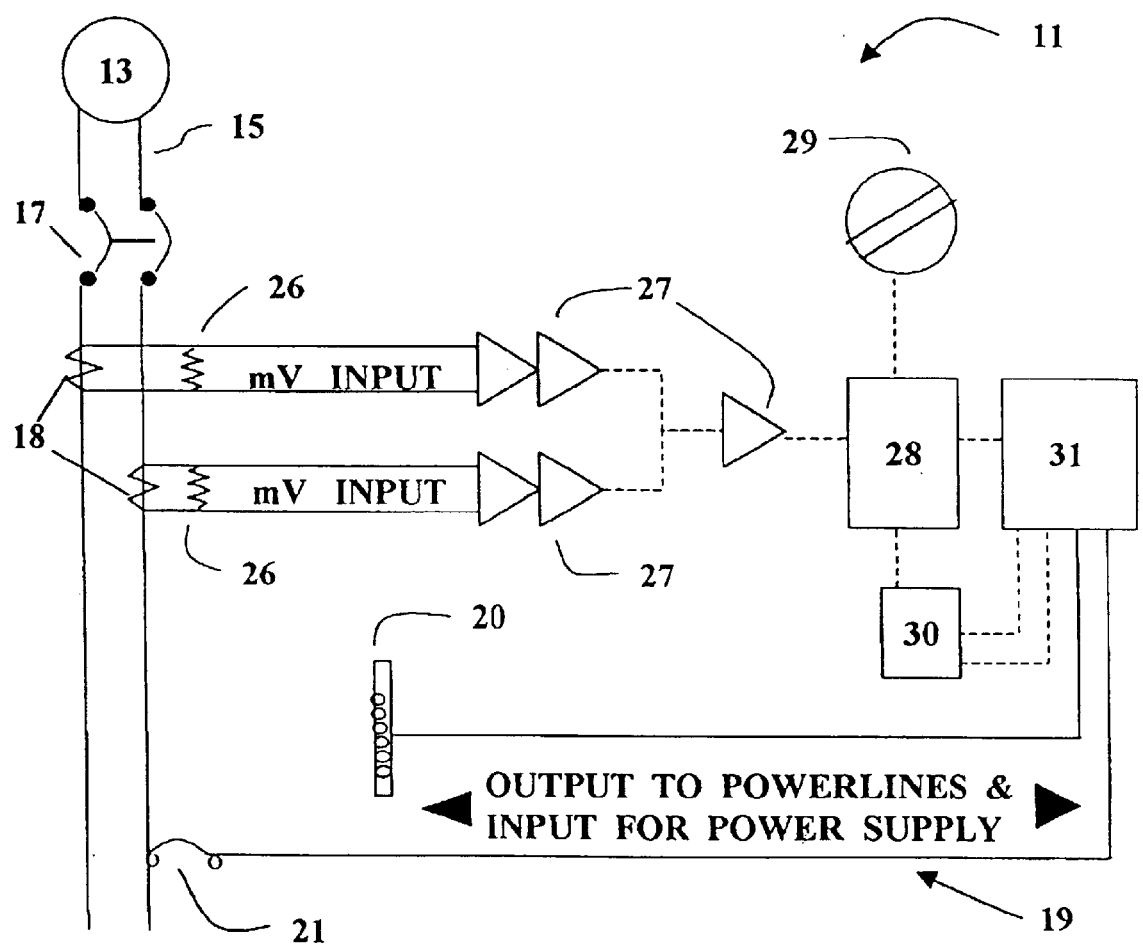
FIG. 2 is a schematic diagram for a Measuring Transmitting Unit according to the present invention.
Figure 3:
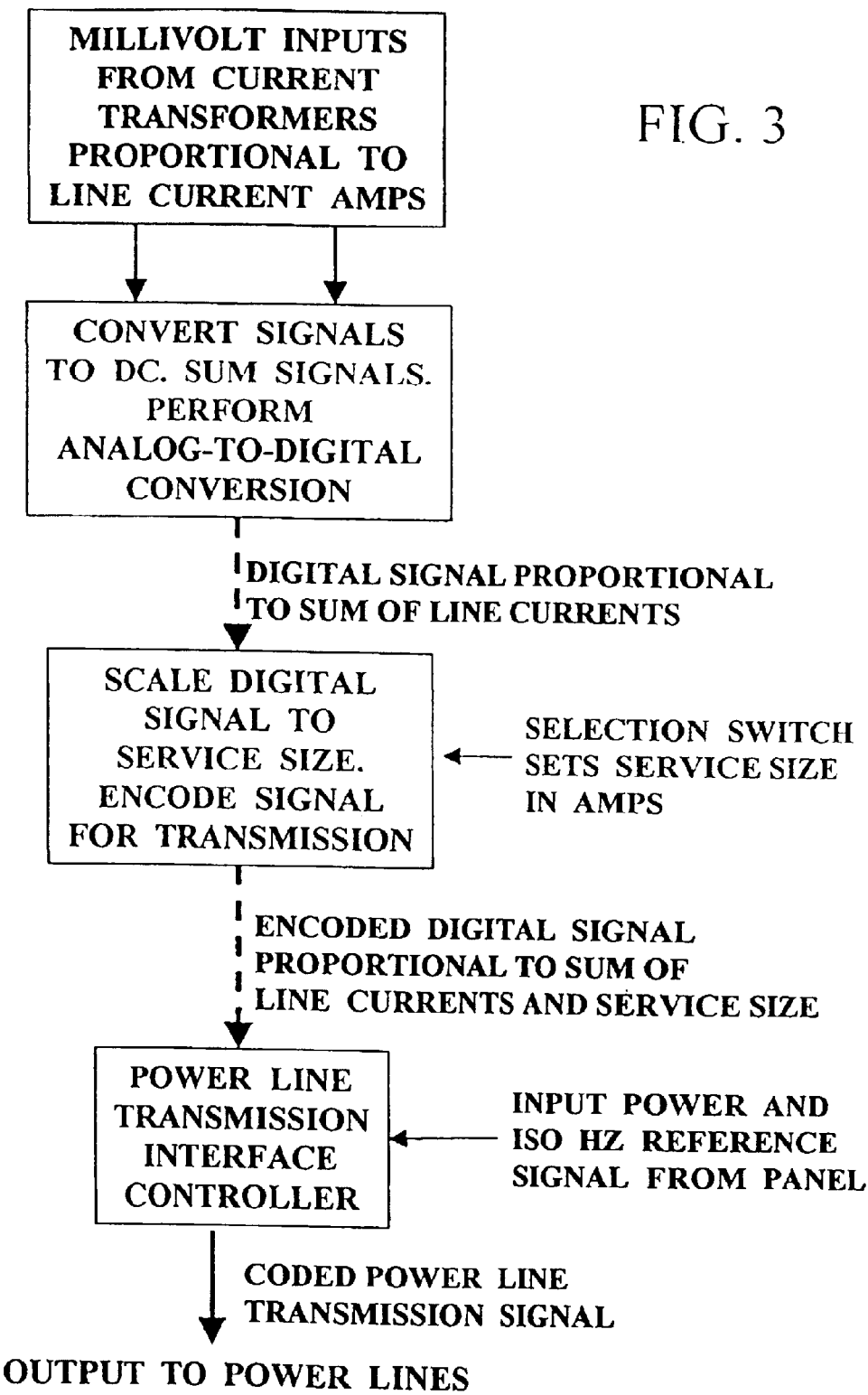
FIG. 3 is a logic diagram for the Measuring Transmitting Unit according to FIG. 2.

FIG. 2 is a schematic diagram showing major components of the Measuring Transmitting Unit (MTU) 11, and FIG. 3 is a logic diagram of the Measuring Transmitting Unit 11 depicting the operation of the Measuring Transmitting Unit 11. Referring to FIG. 2, the main service power circuit 15 typically found in a residence or business runs from the utility company's meter 13 to a main breaker 17 in the consumer's circuit breaker panel 16 or firstly to a separate main breaker (or fused switch) and then to the circuit breaker panel. Two current transformers 18 (three for 3 phase services) clip over the power wires. The current transformers are pre-wired to the Measuring Transmitting Unit. The Measuring Transmitting Unit is also wired to a circuit breaker 21 and the panel neutral bus bar 20 forming a 120V power circuit for the Measuring Transmitting Unit power supply 30. The Measuring Transmitting Unit comprises of a number of amplifiers 27, a microcontroller 28, a power supply 30, a power line carrier transmission interface controller 31, and various standard electronic components such as resistors and capacitors, which are not shown in the figures for clarity.

A real time proportional AC analog current signal is induced in each of the current transformers. The current ($I_{CT}$) induced is equal to the current flowing in the power conductor ($I_L$) times the turns ratio of the current transformer (N). The current is allowed to flow through the burden resistors 26. This converts the signal from current to voltage and protects from hazards associated with open circuit current transformers. The voltage produced ($V_{CT}$) is equal to the current $I_{CT}$ times the resistance R. The voltage produced therefore is proportional to the line current.

$$V_{CT} = I_L \times R \times N$$

The values of R and N are chosen such that the signal produced is in millivolts or small volts, and is safe and easily worked with. The voltage produced from each current transformer then forms the input to the amplifiers 27 in the Measuring Transmitting Unit.

Millivolt (mV) input from the current transformers 18 proportional to the line current amps are input via external connections to the Measuring Transmitting Unit. In FIGS. 2 and 3, external connections are indicated by solid lines and internal connections by dashed lines. The amplifiers provide differential input, convert the AC analog signal to a DC analog signal, sum the signals received from each of the power lines (two for single phase, three for 3-phase), provide proper voltage gain for analog-to-digital (A/D) scaling, and output a DC voltage proportional to the total main power line current to the MTU microcontroller 28. Alternatively each of the analog signals could be changed to digital and the digital signals could be summed after A/D conversion.

The MTU microcontroller 28 converts the analog DC signal received to a digital signal via an on chip analog to digital (A/D) converter. A preferred embodiment to improve the accuracy of the present system is a service size selector switch 29 connected to the MTU microcontroller 28. This may be set by the consumer to match as closely as possible the size in amps of the main breaker. The service size then reflects the maximum current that can flow in each leg of the power wires prior to tripping the main breaker or blowing the main fuses. The digital signal is scaled according to the service size selected, so that a signal received which is equal to the service size set would equal the maximum number that can be transmitted using an 8, 10, 12, or 16 bit format. A 10 or 12 bit format is preferred because it balances the cost of transmission and accuracy considerations. For example, a 10 bit format can have any integer number from 0 to 1023. If the selector switch is set to 100 Amps (A) on a single phase system and the current measured in Phase A is 30 A and in Phase B is 50 A, for a sum of 80 A, then the scaled digital signal to be transmitted would be=80 A/(2×100 A)×1023= 409.

The microcontroller then encodes the scaled signal and transmits it to the power line carrier transmission interface controller 31, approximately once per second. The power line carrier transmission interface controller 31 then transmits the digital signal over the existing power circuits within the building using the same wires 19 that power the MTU power supply. The microcontroller also receives a 60 HZ reference signal from these same lines and performs timing functions required by the power line carrier transmission interface controller 31. Power line carrier transmission systems use varying protocols; therefore the specific requirements for timing and encoding of signals vary depending on the type of controller and protocol being used.

FIG. 3 is a logic diagram showing how the AC current flowing in the power lines is changed to a digital, scaled, coded signal, and then transmitted over the existing power circuits within the building using power line carrier transmission technology.

Figure 4:
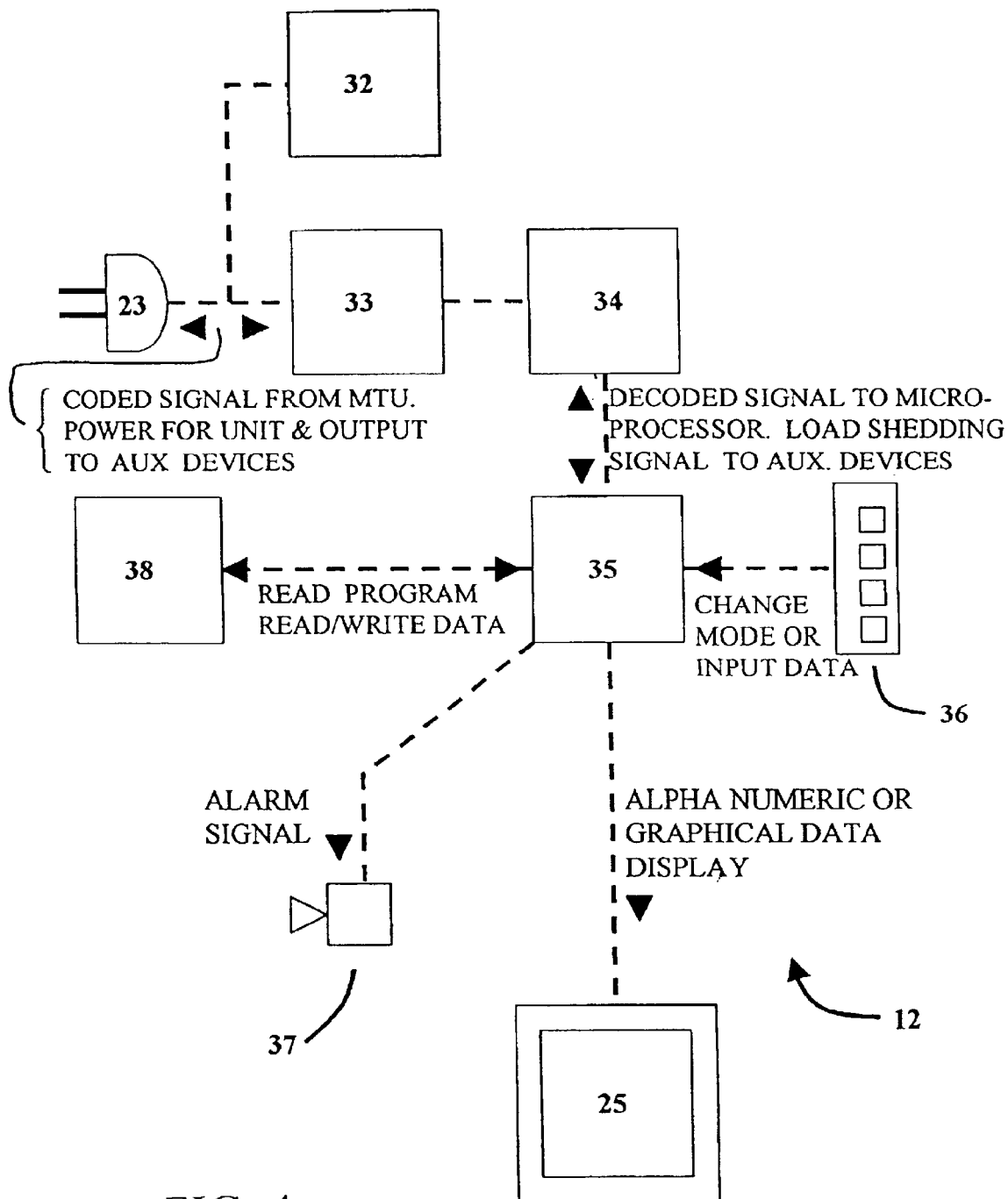
FIG. 4 is a schematic diagram for a Receiving Display Unit according to the present invention.

FIG. 4 is a schematic diagram showing major components of the Receiving Display Unit (RDU) 12. Referring to FIG.

4, the Receiving Display Unit is plugged into a standard wall receptacle via a power plug 23. A coded digital signal is received from the Measuring Transmitting Unit 11 through the building's power wiring using power line carrier transmission technology. The power plug also provides a source of power for the RDU power supply 32, a 60 HZ reference signal necessary to time power line transmissions, and a way to send coded signals back through the power lines for load shedding.

For any of the embodiments described herein, a Receiving Display Unit power line carrier transmission interface controller 33 receives the coded signal from the Measuring Transmitting Unit and a data decoder/encoder 34 decodes the signal. An updated signal is preferably received approximately once per second and this signal is continuously sent to a RDU microcontroller 35. The Receiving Display Unit microcontroller preferably includes internal or external RAM and EEPROM memory 38, for manipulating and storing data PROM or EPROM 38 memory for storing the controlling program. EEPROM stands for Electrical Erasable Programmable Read Only Program, EPROM stands for Erasable Programmable Read Only Program, and PROM stands for Programmable Read Only Program. The microcontroller also includes an internal or external electronic (digital) clock with battery backup. The microcontroller is connected to a Liquid Crystal Display 25, which is preferably lighted, and a set of input and mode buttons 36 located on the face of the Receiving Display Unit. These buttons allow the user to input setup data and control the mode of the LCD display.

Figure 5:
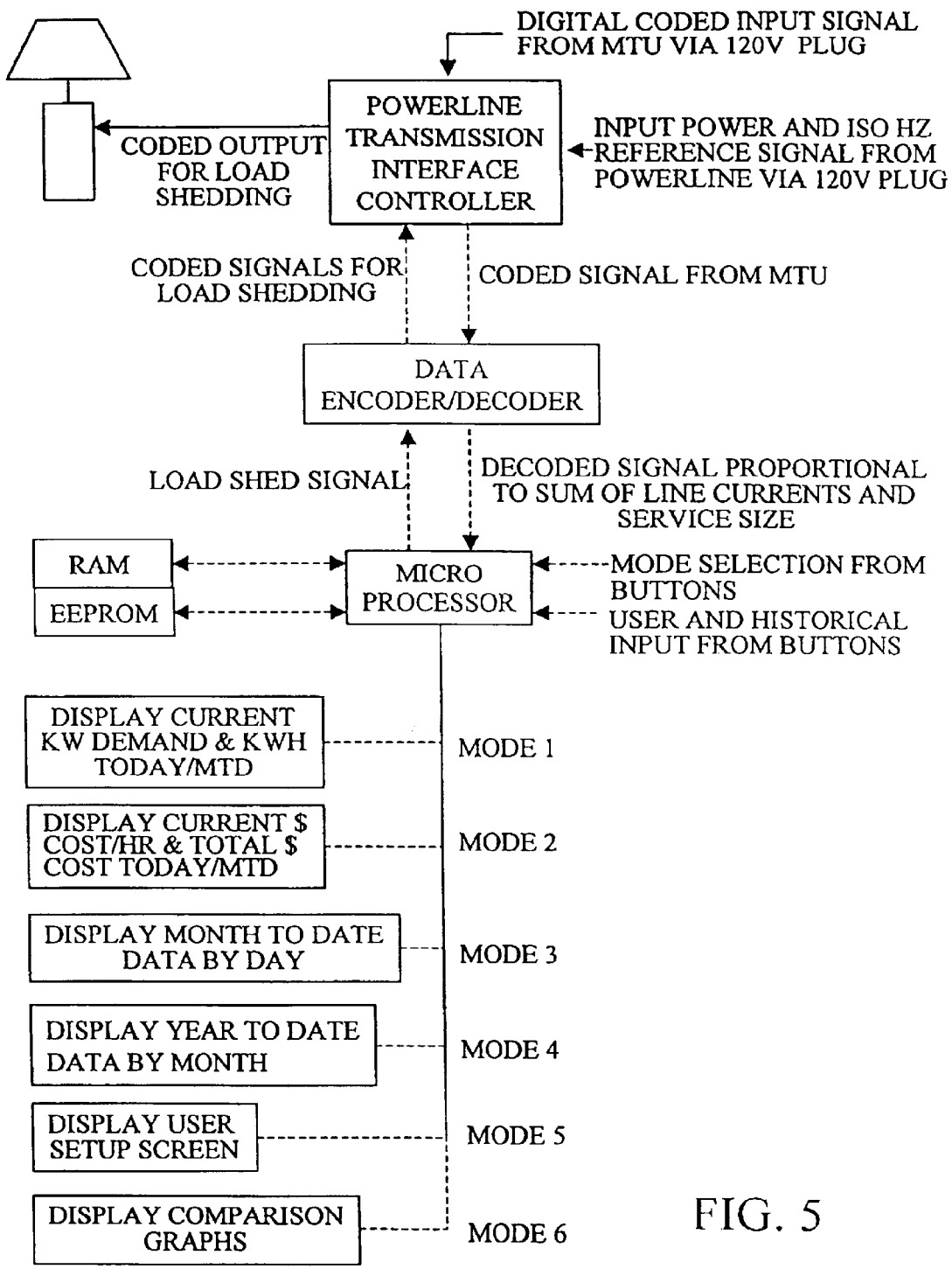
FIG. 5 is a logic diagram for a Receiving Display Unit according to FIG. 4.

FIG. 5 is a logic diagram of the Receiving Display Unit. The operation of the RDU microcontroller 35 is preferably controlled by a program stored in EPROM or PROM memory. Current and historical data and setup parameters are preferably saved in EEPROM. Alternatively, this information can be saved in RAM with battery backup. RAM is used for temporary storage of data. The decoded signal received by the RDU microcontroller 35 is in digital format and is proportional to the sum of the line currents in the main service power lines and the service size selected at the Measuring Transmitting Unit. As part of the setup routine, the user must set the current time and date, select the service size to match the service size selected at the Measuring Transmitting Unit, set the utility meter billing date cycle and input the cost per Kilowatt Hour charged by the utility company. The Receiving Display Unit will preferably accept utility rates that vary with time of day, month of year or with total usage for the month. The user also has the option to adjust the phase to neutral voltage from the preferred default value to more closely match the actual measured voltage at the main circuit breaker. From this information, the microcontroller calculates the current electrical power demand P in kilowatts. Referring to the example cited previously above for the Measuring Transmitting Unit, using a 10 bit transmission format, the service size selector switch set at 100 A at both the Measuring Transmitting Unit and Receiving Display Unit, and a signal being received of 409, the microcontroller makes the reverse calculation for the sum of the line currents:

$$I_L=(409/1023)\times(2\times100)=80\ A$$

Assuming the user has set the line to neutral voltage at 120V, the current kilowatt power demand is then calculated as:

$$P=I_L\times V=(80\ A\times 120\ V)/1000=9.600\ KW$$

Equivalent routines may be used to overcome computational limitations of the RDU processor. This amount can then be displayed on the LCD screen and will be updated approximately every second. The microcontroller then calculates the current cost of electrical usage per hour by multiplying the KW power demand×the then current utility rate per KWH to derive a current demand cost in Dollars per hour. Models for different countries would use different monetary units. This amount can then be displayed on the LCD screen.

The current signal is most preferably updated every one or two seconds, called the time period $T_p$. Preferably, the Receiving Display Unit then calculates the total energy consumed KWH over the time period by multiplying the current electrical power demand×time period, adjusting for hours to seconds the calculation is:

$$KWH=(P\times T_P)/(60\times 60).$$

This value is saved in a register in the EEPROM memory (KWH_TODAY). Each time period, KWH is added to the value stored in "KWH_TODAY." The amount stored therefore reflects the total KWH usage accumulated for the day. KWH can then be displayed on the LCD screen. At the end of the day the amount in the register is saved. The daily totals are stored each day for historical purposes. "KWH_TODAY" is then reset to zero and the process begins again for the new day. "KWH_TODAY" can then be displayed on the LCD screen. Similarly, the microcontroller, using the utility billing rate applicable to the time period, stores in memory the current dollar cost so far for the day (DOLLARS_TODAY). This amount can then be displayed on the LCD screen. At the end of the day this amount is saved and registered to zero. At the end of the billing cycle month, the total KWH usage and dollar cost for the month is calculated and recorded. As the Receiving Display Unit uses the same time period as the utility company does for billing purposes, these amounts should closely match the user's electricity bill. The monthly total amounts are saved in EEPROM each month for historical purposes and the month-to-date registers are reset to zero. EEPROM memory is preferably used to ensure that no data is lost in case of power failure or unplugging the Receiving Display Unit.

For any of the embodiments described herein, the microcontroller can manipulate all of the stored data and display the information in various alphanumeric or graphical formats on the LCD screen. The user changes the display screen through the use of the mode buttons.

As part of the setup routine the user can input alarm settings for any of the embodiments described herein. Alarms can be set for maximum KW demand, maximum dollars per hour power demand, or for maximum dollar cost for the month to date. Alarms will display on the LCD screen. A preferred embodiment will provide an audible alarm.

Another preferred embodiment herein provides load shedding for turning off certain electrical loads when alarm conditions are exceeded. Devices are available that will respond to coded signals and can be used to shut-off appliances and other electrical devices. The user sets the Receiving Display Unit to send out a signal matching the protocol address of the device(s) when an alarm condition is exceeded. These devices will shut off the loads attached to the devices upon receipt of the signal. These devices usually employ error checking to ensure that stray signals do not accidentally cause operation of the device. The RDU microcontroller 35 sends the signal using the same encoder/decoder 34 and power line carrier transmission controller 33 used for receiving the signal from the Measuring Transmitting Unit. Similarly, data from the Receiving Display Unit can be transmitted to a personal computer using existing devices that are on the market.

The present electrical monitoring system is simple to use and install, and can be programmed by the user. The preferred embodiment can be programmed to sound an alarm or to shut off appliances within the building when a pre-set level of electricity usage is reached. The system receiver can easily be moved from room to room within the residence or business. The entire monitoring system can easily be removed and reinstalled in another residence. The system measures electricity as it is being consumed. For example, if a light is turned on, the electricity thus consumed is contemporaneously displayed (almost immediately) on the receiver display. The user-consumer has a visual measure of how much electricity is consumed by each appliance, etc. in the house. The consumer can adjust usage of the various appliances, depending upon how one wishes to budget. The consumer can reduce usage, or one can postpone usage to periods in the day or night when the power company rates are lower. Many power companies charge on a sliding scale, with a higher rate during peak usage times and a lower rate late at night. The present electricity monitoring system enables the consumer to have greater control over power consumption.

Just after the programmable electricity monitoring system 10 is installed, billing and demand electrical rates charged by the utility company and billing cycle date would be entered manually by the consumer. Preferably, the consumer could enter this historical data from previous months electric bills. This allows the apparatus to begin displaying electrical cost of consumption data in addition to KW (kilowatt) demand and KWH (kilowatt hour) usage. It is only necessary for the consumer to enter this data at initial set-up, or when rates are changed by the utility (power) company. An advantage of the present system is that output closely matches monthly billings by the utility company. This apparatus is able to accept various utility billing rates, including time of day changes, month of year changes, and monthly consumption changes. It displays information in a format that is suitable for home or business use. The electrical utility industry is changing rapidly with the onset of deregulation. This will certainly lead to new and more innovative rate schedules. The present device as described is capable of accepting billing rate schedules commonly used today. Future models can incorporate changes that may be required by changing the program stored in PROM or EPROM memory. A preferred embodiment would be to offer updated program versions by allowing the consumer to purchase an updated program chip to update an older model.

Preferred embodiments of the present monitoring system allow automatic load shedding of appliance and other loads. To use this function, the consumer uses the Receiving Display Unit 12 to pre-set a maximum level of electricity demand or daily or monthly consumption. When a pre-set level is reached, the monitoring system will automatically shut off certain appliances in the residence, such as the hot water heater or air conditioner.

The display 25 on the Receiving Display Unit 12 is preferably visual, but the programmable electricity monitoring system 10 could be set up to emit a voice recording. The voice could be heard in addition to or instead of (e.g. for a hearing impaired user) the visual display, and the voice message could sound at the push of a button on the receiving unit 12 or when a specific pre-set usage level is reached.

A user preferably purchases an electricity consumption monitoring system kit from a store for installation in his or her residence or business. In an embodiment according to FIG. 1, this consumer-friendly kit comprises (and preferably consists essentially of) the Measuring Transmitting Unit 11 and separate Receiving Display Unit 12 described herein. An energy saving tip booklet and installation instructions would ideally be included in the kit. The kit is preferably comprised of two separate units: a Measuring Transmitting Unit, and a programmable Receiving Display Unit, as described herein. For the embodiment of FIG. 1, the Measuring Transmitting Unit 11 preferably further comprises:

a service size selector switch 29 for inputting to the MTU microcontroller 28.

at least two, preferably seven, amplifiers 27;

two or three burden resistors 26 for converting a current signal from the current transformers to voltage.

For any of the embodiments described herein, the Receiving Display Unit preferably further comprises:

an audible alarm 37;

a digital clock with a battery back-up.

RAM or EEPROM memory for manipulating and storing data, and PROM or EPROM memory for storing a software program; and/or a means for transmitting coded signals back through the power lines in the residence or business for load shedding.

For the embodiment of FIG. 1, the Measuring Transmitting Unit, except for the power wires 19 and the current transformers 18, is preferably enclosed by a protective cover. The Receiving Display Unit is enclosed by a protective cover. The present system is preferred for use in residences or small businesses with services sizes less than or equal to 400 Amps.

Referring to the embodiment of FIG. 1, the Measuring Transmitting Unit 11 is designed to mount in or near the consumer's main circuit breaker panel 16 (main switch box or main panel box) and includes the following.

1. Specially designed split core current transformers 18 with squeeze clips to allow safe, easy installation over the consumer's main service power lines 15 without disconnecting power, to measure amperage of main supply lines and integral burden resistor 26 to convert amperage signals to millivolt signals.
2. A protected power supply to provide power for the measuring transmitting unit 11 from an individual breaker 21 in the consumer's circuit breaker panel 16.
3. Amplifiers 27 to provide differential input, convert AC signal to DC, provide proper voltage gain for A/D conversion, and sum the signals from each current transformer.
4. A microcontroller to perform analog-to-digital conversion, scale the signal to service size, encode the signal for transmission, synchronize signals with power line frequency and provide timing for signal bursts to the transmitter.
5. An opto-coupled Power Line Carrier Technology (PLCT) transmitter to transmit signal over the consumer's existing power lines.

Power in KW is equal to the voltage times the current times the power factor for single phase systems. Power in KW is equal to the line voltage times the current times the power factor times the √ (square root) of 3 for three-phase systems. In both cases, for grounded neutral systems, power in KW is equal to the sum of (the phase current times the phase to neutral voltages), times the power factor.

For any of the embodiments described herein, the preferred Measuring Transmitting Unit does not measure the voltage of consumer supply lines but instead assumes a standard constant utility phase-to-neutral supply voltage and sets this as the preferred default value. For a North American model, the default value would be set to match the average utility supply voltage in United States metropolitan areas. The user/consumer will have the option to adjust this value at the Receiving Display Unit 12. Power factor is assumed to be unity. These assumptions make the device unsuitable for utility billing, or for precise measurement usually required by large power users. Rather, this device is designed to continuously simulate, with an reasonable degree of accuracy, the energy usage measured by and the billing rendered by the utility. The device is designed for residential and small business use and emphasizes ease of use and installation and reasonable cost. Alternatively, the supply voltage could be measured by the Measuring Transmitting Unit and the Measuring Transmitting Unit could calculate power and transmit a signal proportional to power rather than current, or both voltage and current data could be measured and transmitted and the power calculation made by the Receiving Display Unit. The preferred device, for the North American market, does not measure voltage as voltage regulation in most parts of the United States and Canada is very good and exceeds the accuracy achievable through voltage measurement, without the use of exceedingly expensive components. There will preferably be two different models for the Measuring Transmitting Unit. A single phase Measuring Transmitting Unit is preferred for residential and small business use, and a three phase unit is preferred for commercial use. A selector switch on the Measuring Transmitting Unit 11 will allow the consumer to set the Measuring Transmitting Unit 11 to standard electrical service sizes. For example: 60 A, 100 A, 150 A and 200 A for a single phase unit and 100 A, 200 A, 300 A & 400 A for a three phase unit.

For any of the embodiments described herein, the preferred Receiving Display Unit herein is designed to plug into any standard 120 volt receptacle within the consumer's premises and most preferably includes the following.

1. An opto-coupled PLCT receiver/transmitter to receive signals from the Measuring Transmitting Unit.
2. A protected power supply to receive power from consumer's supply and convert for use by the Receiving Display Unit.
3. A first microcontroller to synchronize signals with the power line frequency and provide timing and error checking for receiving signals from the Measuring Transmitting Unit and provide analog to digital conversion.
4. A digital clock with battery backup to maintain accurate time in case of power failure.
5. A PROM or EPROM chip to store the software program, a RAM chip for data manipulation, and an EEPROM chip to store current and historical data and setup parameters.
6. Input buttons to allow the consumer to input setup data and alter display modes of the LCD.
7. A second microcontroller to receive confirmed data from the first microcontroller, receive data from consumer operable input mode buttons, run the software program, retrieve and save information from memory, transmit display information to LCD display, transmit data to the first microcontroller and then to the PLTC receiver/transmitter unit for load shedding by remote PLTC devices or further manipulation by a personal computer. Any or all of the above functions may be combined in currently available electronic components.

In regard to the LCD display on the Receiving Display Unit for any of the embodiments described herein, the following information can be preferably selected for display through a number of preferred display modes:

a. Current time and date
b. Current electrical usage in kilowatts (KW)
c. Current cost for electrical usage in dollars per hour (or other currency for non-U.S. models)
d. Total electrical usage so far today in kilowatt hours (KWH)
e. Total cost for electricity so far today in dollars
f. Total electrical usage so far this month in kilowatt hours
g. Total cost for electricity this month so far in dollars
h. Energy used each hour for the past 48 hours in KWH and dollars
i. Energy used each day for the past 60 days in kilowatt hours and dollars
j. Total energy used each month for the past two years in kilowatt hours and dollars
k. Graphical displays of the above information Current and historical electrical usage and cost data can be displayed for the consumer to use in conserving energy and cutting electricity costs.

The program is easily modified during manufacture to incorporate updated enhancements simply by modifying the program installed in PROM or EPROM. Specific information displayed and format will be tailored to consumer demand.

New Embodiments

Figure 6:
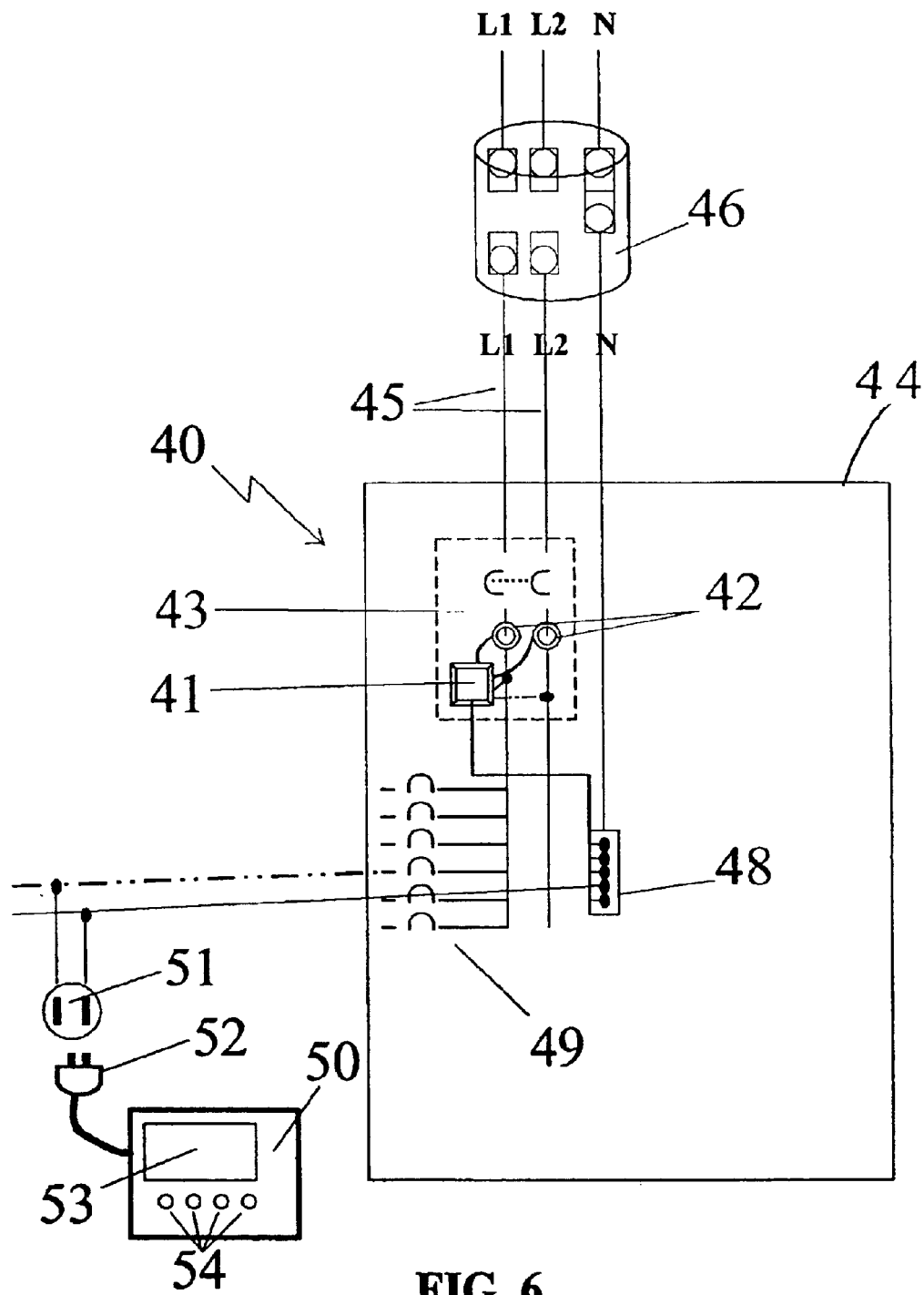
FIG. 6 is an overall schematic diagram showing an alternate embodiment of an electricity consumption monitoring system according to the present invention.

Turning to FIG. 6, an alternate embodiment of a Measuring Transmitting Unit 41 herein is an integral part of the utility meter or main circuit breaker, rather than being a separate unit connected to the circuit breaker panel. The Measuring Transmitting Unit 41 at the consumer's circuit breaker panel transmits data using power line carrier technology to the Receiving Display Unit 50, which is plugged into a wall outlet at a convenient location within the consumer's residence or place of business (e.g., the kitchen, hall, or bedroom). As described herein, the Receiving Display Unit 50 displays energy usage on an RDU screen, preferably in both kilowatt-hours and dollar units. The Receiving Display Unit 50 measures and displays energy usage without the aid of the electric utility.

A contractor or builder preferably purchases a main circuit breaker with built-in Measuring Transmitting Unit 41 from a store for installation in the residence or business (see FIG. 6). The consumer separately purchases a Receiving Display Unit 50, as described herein. An energy saving tip booklet and installation instructions is ideally included with the Receiving Display Unit.

As shown in the electricity consumption device embodiment 40 illustrated in FIG. 6, a Measuring Transmitting Unit 41 is connected to current sensing modules 42 in the main circuit breaker 43 within the consumer's circuit breaker panel box 44. Main service power lines 45 extend between the main circuit breaker 43 and a utility meter 46 and back to the utility supply 47. Preferably, each current sensing module 42 includes a permanently wired burden resistor in the Measuring Transmitting Unit to preclude the possibility of large open circuit voltages associated with open circuit current transformers. The Measuring Transmitting Unit sums the analog signals, performs an analog-to-digital conversion, and then encodes the digital signal and transmits the encoded signal over existing power wiring within the home or other building using power line carrier transmission technology. Once installed, the Measuring Transmitting Unit will function indefinitely until removed.

With the Measuring Transmitting Unit built into the main circuit breaker, the builder or contractor in a new installation can provide a circuit breaker panel with a main circuit breaker 43 that includes a complete MTU 41. Also, a utility contractor can install a utility meter with an integrated MTU component in a new or existing residence or business. Thus, the consumer can simply plug it in and program a Receiving Display Unit 50 to complete the Electricity Consumption Monitoring System installation. This alternate Measuring Transmitting Unit embodiment also does not require connection to a branch circuit breaker 49 in order to provide power to the Measuring Transmitting Unit and a connection to the residence or building power circuits, for Power Line Carrier Transmission.

The programmable electricity monitoring system 40 is ideal for use in a residence or small business because of its ease of installation, programming and use. The continuous display is easy for a layman to view and comprehend. Any member of the family who is old enough to read is capable of understanding the "$/hr" portion of the display. In short, this electricity usage monitoring system is user-friendly.

In this preferred embodiment 40, a Receiving Display Unit 50 is plugged into an AC receptacle 51 via a power plug 52 on the Receiving Display Unit. Energy usage is displayed on a display screen 53 of the Receiving Display Unit 50, preferably in both kilowatt-hours and dollar units. Once the Receiving Display Unit 50 is plugged in, it will commence receiving digitally encoded signals being emitted by the voltage sensing and transmitting Measuring Transmitting Unit 41. The Receiving Display Unit 50 receives and decodes the encoded signals, processes the information through an internal microcontroller, and then displays the information on the display screen 53 on the face of the Receiving Display Unit 50. The user need not activate the display to receive the digital information; it is a continuous feed. When the user desires information, he or she simply observes the display screen. The Receiving Display Unit most preferably displays KW demand and KWH usage, cost consumption, historical data and other information, as well as graphical representations of the information (as described hereinabove). The mechanism for inputting to the Receiving Display Unit 50 is at least one input or mode button 54 on a face of the Receiving Display Unit (as described hereinabove). The user can advance through the information displayed by use of mode buttons 54, shown below the display screen 53 in FIG. 6.

Figure 7A:
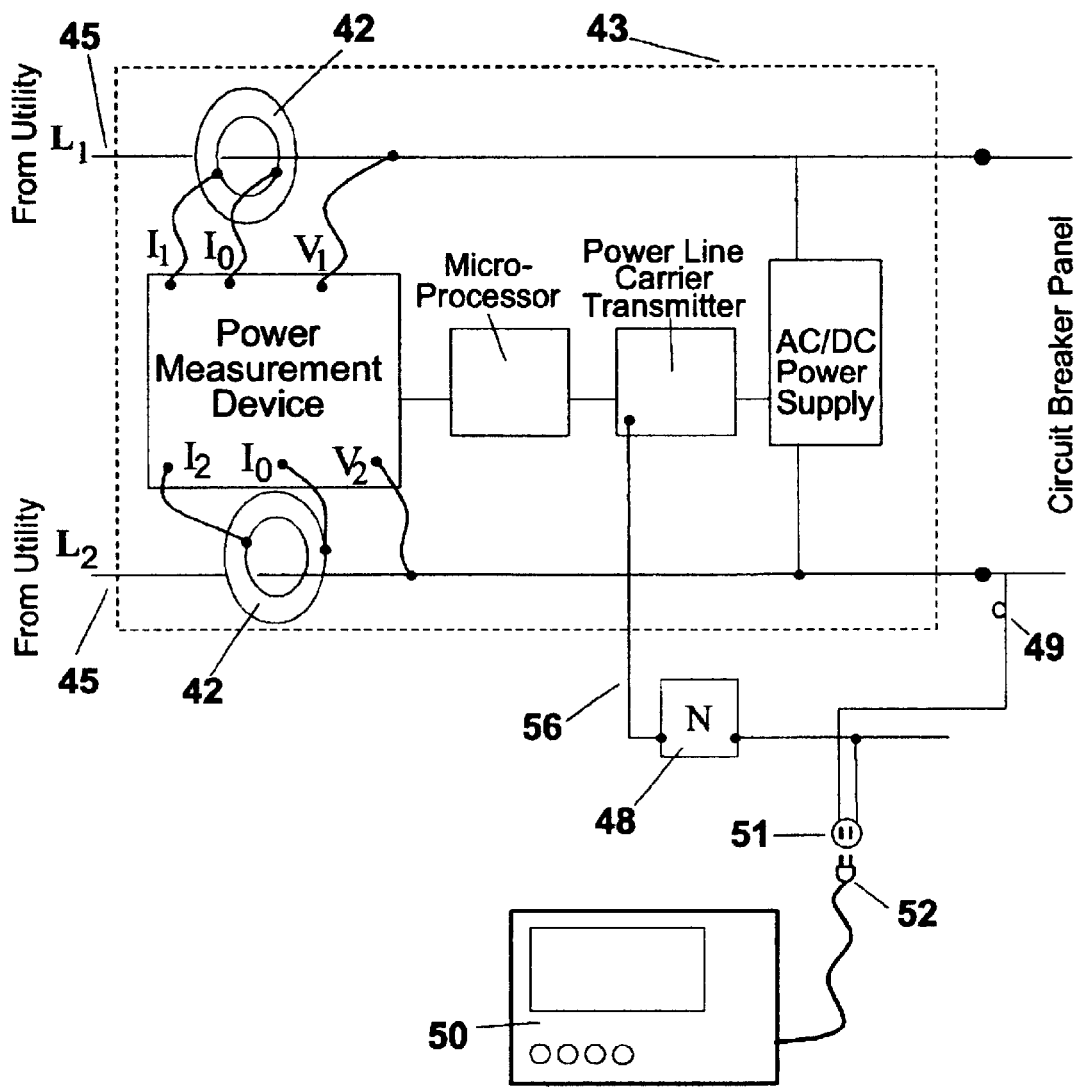
FIG. 7A is a schematic diagram showing an alternate embodiment of an electricity consumption monitoring system according to the present invention.

A schematic diagram of the main circuit breaker 43 for this alternate electrical consumption system 40 is shown in FIG. 7A. The Measuring Transmitting Unit 41 is mounted as an integral part of the main circuit breaker. Included herein is a method for incorporating the current transformers, voltage sensing devices, and measuring and transmitting circuitry as an integral part, or add-on, to a main circuit breaker, as shown in FIG. 7A. This enhancement allows a circuit breaker manufacturer or an installing contractor to make the consumer's electrical panel into a Measuring Transmitting Unit. The consumer then completes the installation by simply purchasing a Receiving Display Unit and plugging it in. The Measuring Transmitting Unit will transmit to the Receiving Display Unit as described herein. Again, energy usage is displayed on the RDU screen in both kilowatt-hours and dollars.

Figure 7B:
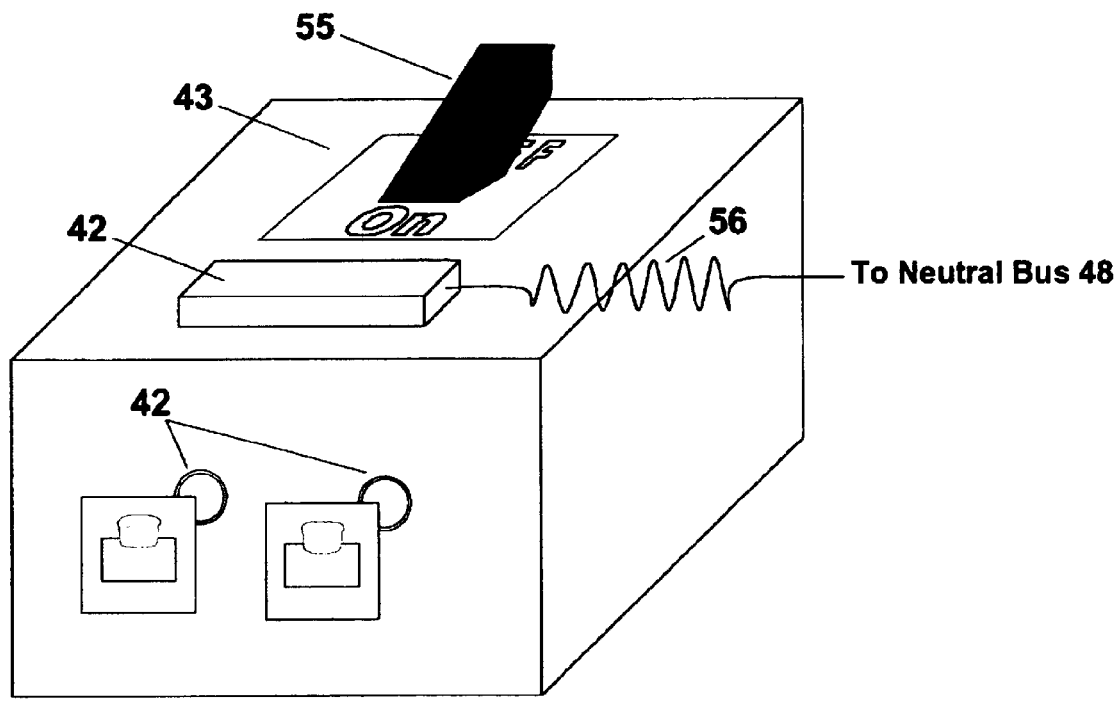
FIG. 7B shows a perspective view of an alternate embodiment of a Measuring Transmitting Unit according to the present invention.

FIG. 7B shows the main circuit breaker 43 in detail. It includes an on-off switch 55, a voltage sensing and transmitting Measuring Transmitting Unit 41 with a wire connection 56 to the neutral bus 48, and current sensing modules 42.

Figure 8A:
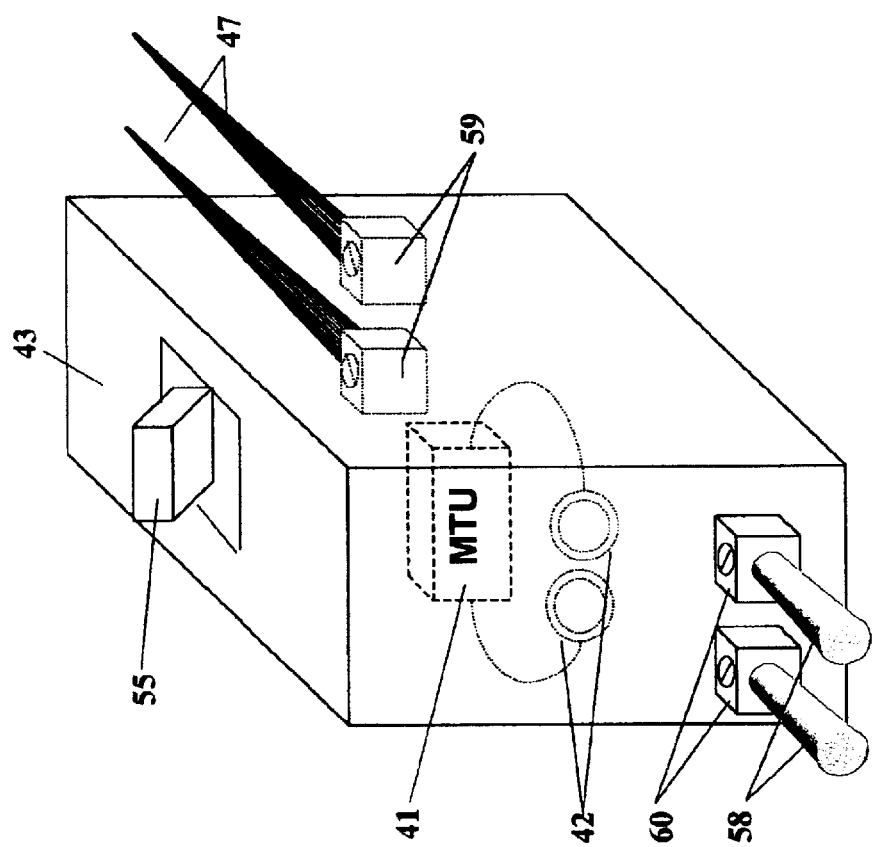
FIG. 8A shows a perspective view of an alternate embodiment of a Measuring Transmitting Unit according to the present invention.

Referring to the embodiment shown in FIG. 8A, a set of current sensing modules 42 and the Measuring Transmitting Unit 41 are manufactured as an integral part of the main circuit breaker unit 43. This option allows a circuit breaker manufacturer, or an installing contractor, to convert the consumer's circuit breaker panel 44 to a Measuring Transmitting Unit. The consumer then need only purchase a Receiving Display Unit 50 and plug it into a wall receptacle. Incoming main power cables 57 and outgoing main cables 58 are held in place by means of incoming lugs 59 or outgoing lugs 60 on the main circuit breaker (see FIG. 8A).

Figure 8B:
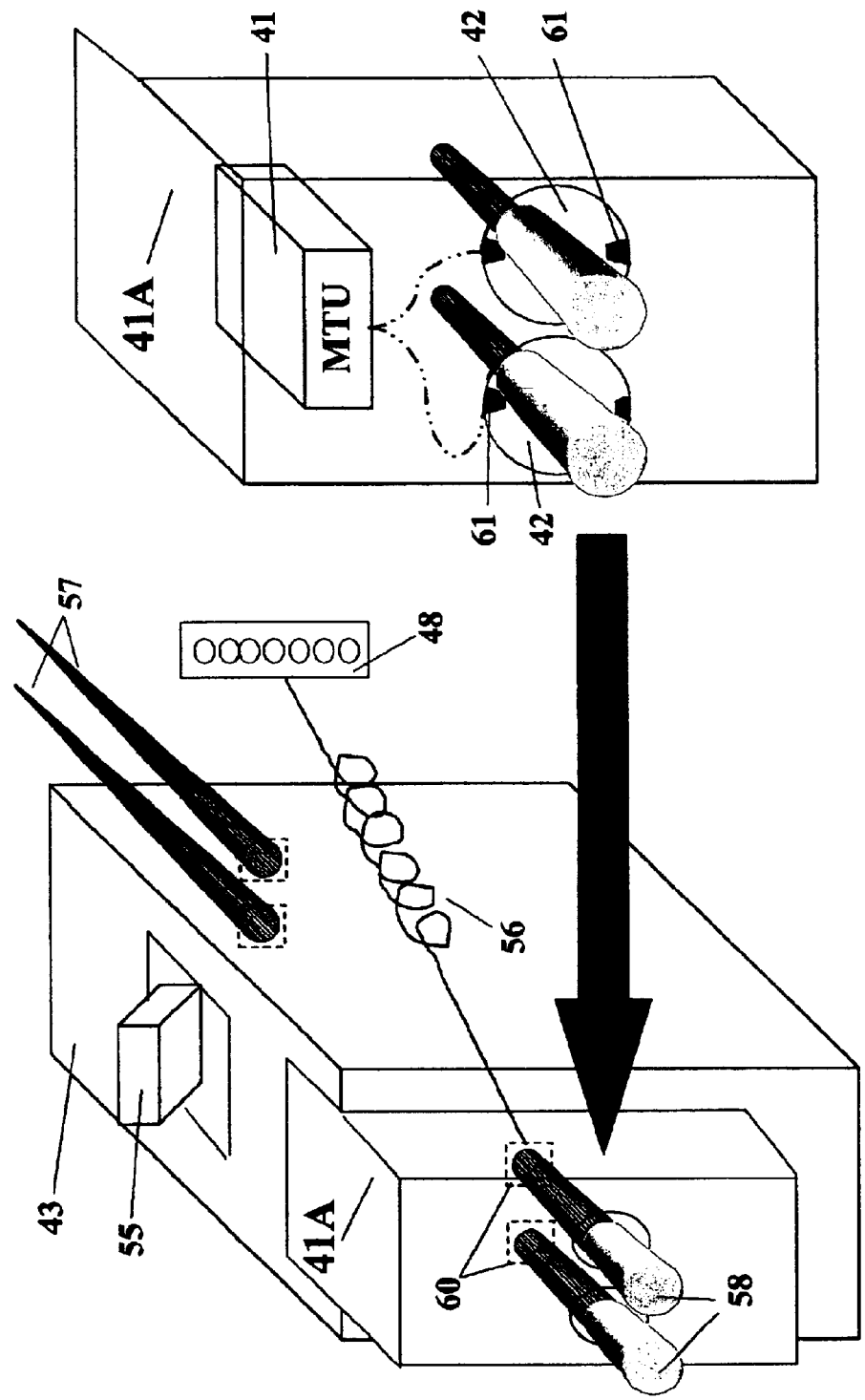
FIG. 8B shows a perspective view of an alternate embodiment of a Measuring Transmitting Unit according to the present invention.

Referring to the alternate embodiment shown in FIG. 8B, a set of current sensing modules 42 and voltage probes 61, and a Measuring Transmitting Unit 41 are manufactured as an add-on to a main circuit breaker 43. This "add-on MTU" 41A can be installed on a main circuit breaker 43 in the field.

Figure 9:
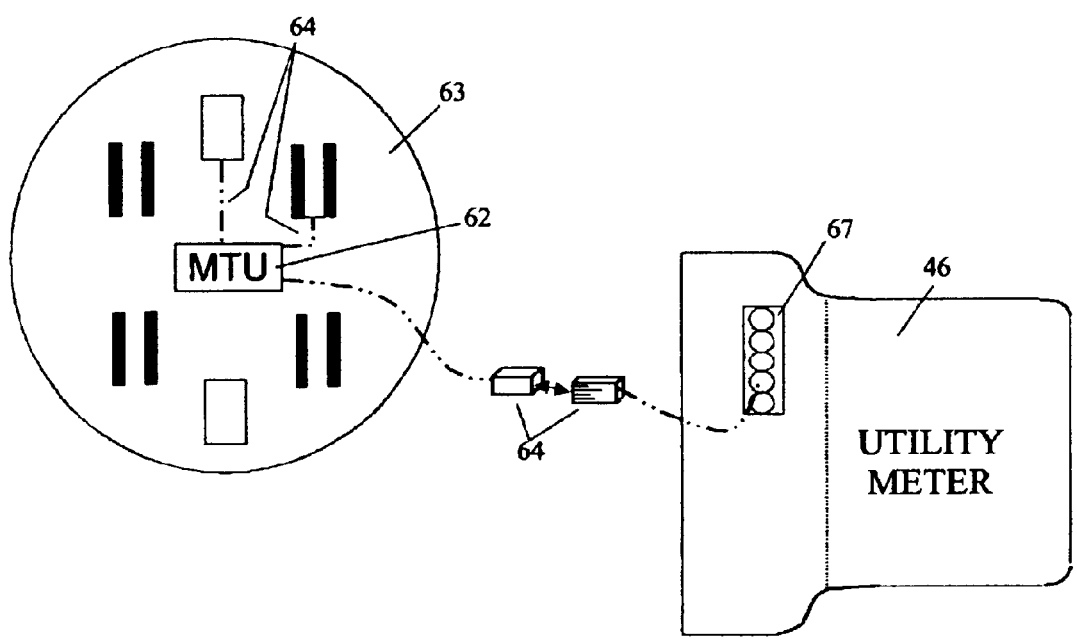
FIG. 9 is a schematic diagram showing an alternate embodiment of a Measuring Transmitting Unit according to the present invention.

In an alternate embodiment shown in FIG. 9, a Measuring Transmitting Unit 62 is incorporated into a base 63 of a utility meter 46 of the residence or business, and connected to the utility meter 46 by power line carrier technology connections 64. Data is transmitted from the utility meter 46 to the MTU 62. Male and female in-line connectors 64 are linked to a terminal strip 67 on the utility meter 46. This embodiment allows a meter manufacturer or a utility to convert an electrical utility meter into an Measuring Transmitting Unit 62. The consumer then completes the installation by simply purchasing a Receiving Display Unit 50 and plugging it in. The Measuring Transmitting Unit 62 will transmit to the Receiving Display Unit 50 as described herein. Again, energy usage is displayed on the Receiving Display Unit, preferably in both kilowatt-hours and dollars.

Figure 10:
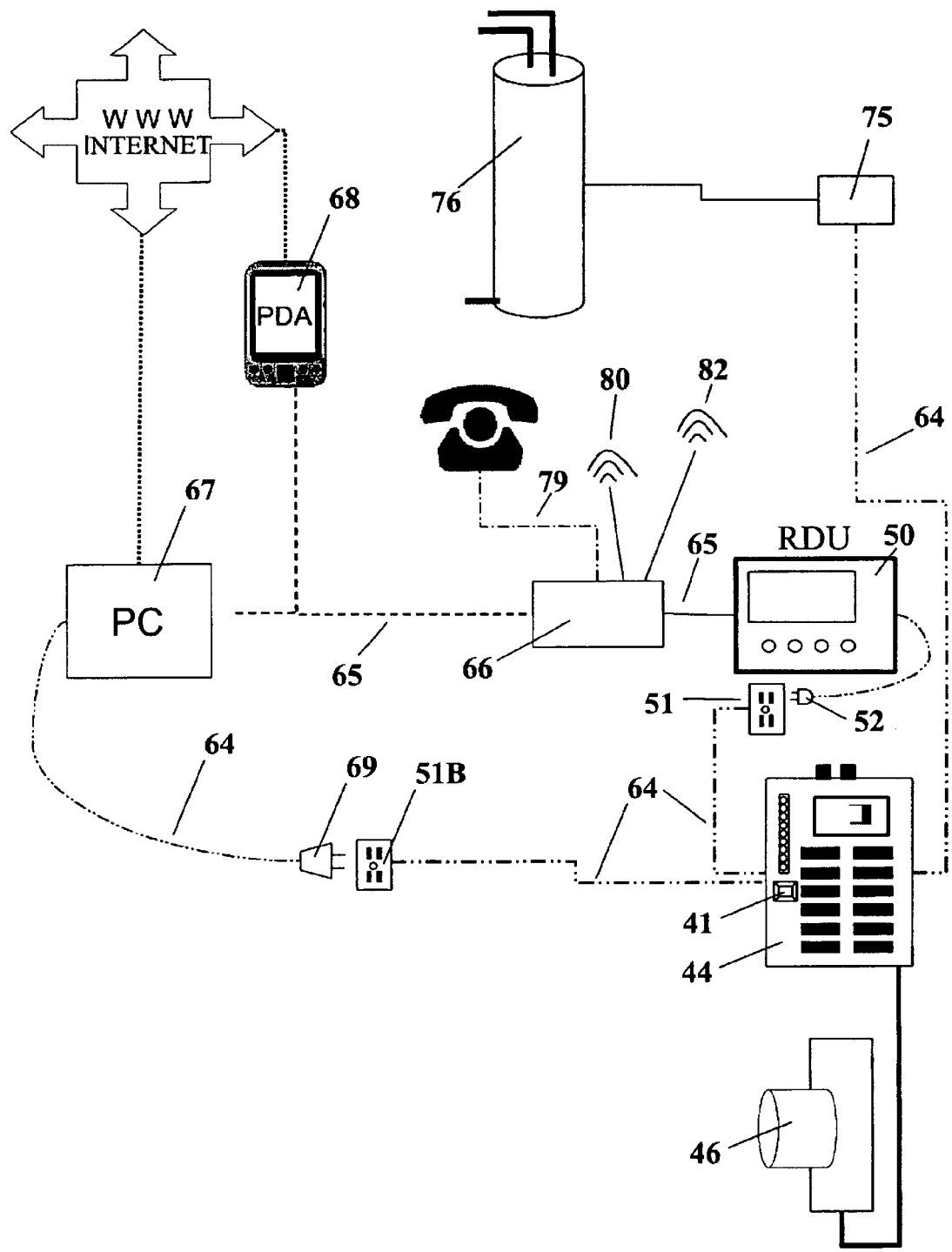
FIG. 10 is a schematic diagram showing an alternate embodiment of a Receiving Display Unit according to the present invention.

Lastly, in addition to available alternatives for the Measuring Transmitting Unit, various Receiving Display Unit alternatives are also available herein. The Receiving Display Unit 50 can be enhanced through the addition of a Gateway 66 that will allow interfacing with a "third party", such as a personal computer or Personal Digital Assistant (PDA) 68, as shown in FIG. 10. In one embodiment, the Gateway is an integral part of the Receiving Display Unit 50. In an alternate embodiment, the Gateway is a separate component connected to the Receiving Display Unit by any suitable means of connection, such as serial, USB, or firewire connection 65, or the like.

As shown in FIG. 10, the Measuring Transmitting Unit at the circuit breaker panel 44 measures power consumption of the residence or business. The MTU 41 transmits the data to the Receiving Display Unit 50 using power line carrier technology via existing power lines 64 (as described hereinabove).

The Receiving Display Unit 50 is linked to a personal computer 67 or a Personal Digital Assistant 68 via a Gateway 66, from which the world wide web Internet can be accessed. The data connection between the personal computer 67 or the Personal Digital Assistant 68 can be a direct serial, USB, firewire, cable, or other suitable connection. If the personal computer 67 or Personal Digital Assistant 68 is not in close proximity to the Receiving Display Unit 50, it is possible to install the Gateway 66 near the personal computer 67 or Personal Digital Assistant 68 and use existing power lines to make a PTLC connection to the Receiving Display Unit 50. The personal computer 67 or Personal Digital Assistant 68 can access the Internet, thus creating a link between the Receiving Display Unit and the Internet.

Either the Gateway 66 or the personal computer 67 or the Personal Digital Assistant 68 can be linked to a land line telephone 79 (via modem or Internet), pager 80 (via modem or Internet), and/or a cell phone 82, thus creating a link between the Receiving Display Unit 50 and a land line telephone 79, pager 80, or cell phone 82.

The Receiving Display Unit 50 can also be linked to at least one load shedding device 75 using power line carrier technology connections 64 via existing power lines. The load shedding device(s) 75 is then connected to any household or business appliances 76 or energy consuming device in the residence or business. The load shedding device(s) 75 may be activated directly from the Receiving Display Unit 50, or via a personal computer, Personal Digital Assistant, telephone, pager, cell phone, or Internet signal.

Figure 11:
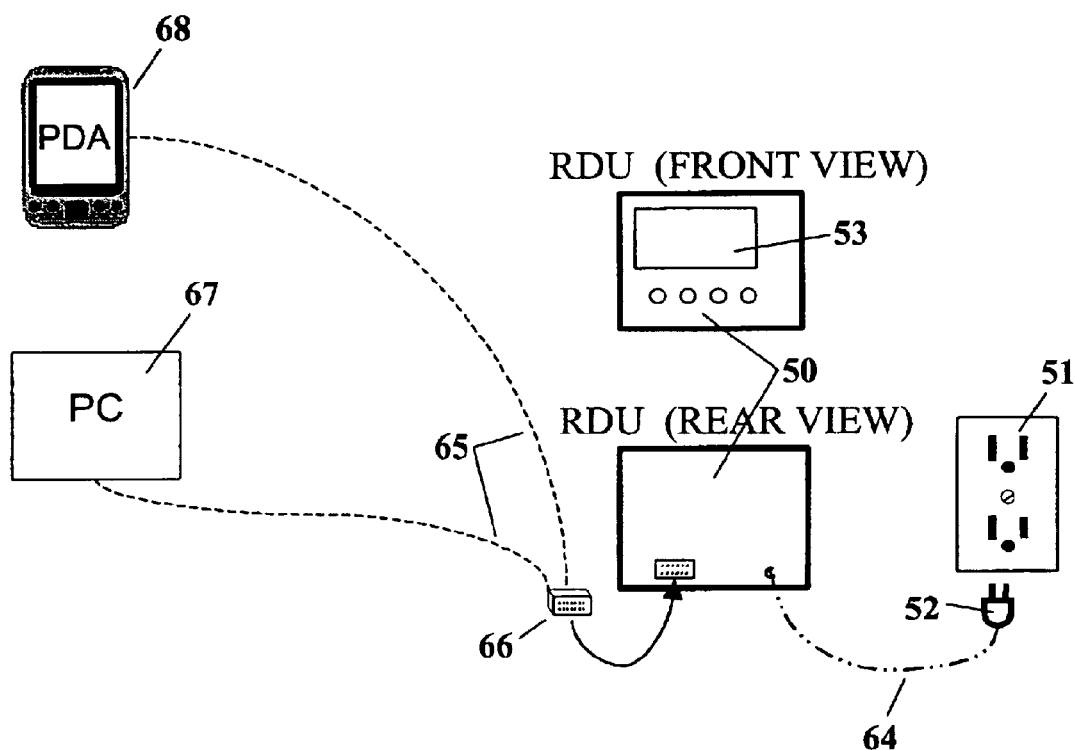
FIG. 11 is a schematic diagram showing an alternate embodiment of a Receiving Display Unit according to the present invention.

The embodiment shown in FIG. 11 includes a Gateway 66 that allows communication between the Receiving Display Unit 50 and the consumer's personal computer 67 or Personal Digital Assistant (PDA) 68 by a serial, USB, or firewire connection 65, or the like. The Receiving Display Unit communicates with the personal computer 67 and/or the Personal Digital Assistant 68 via the serial, USB, or firewire connection 65 or the like through the RDU interface at the rear of the Receiving Display Unit, as shown in FIG. 11. The Receiving Display Unit 50 receives information from the Measuring Transmitting Unit 41, via PLTC connection 64, as described herein, and energy usage is displayed on the RDU screen 53.

Figure 12A:
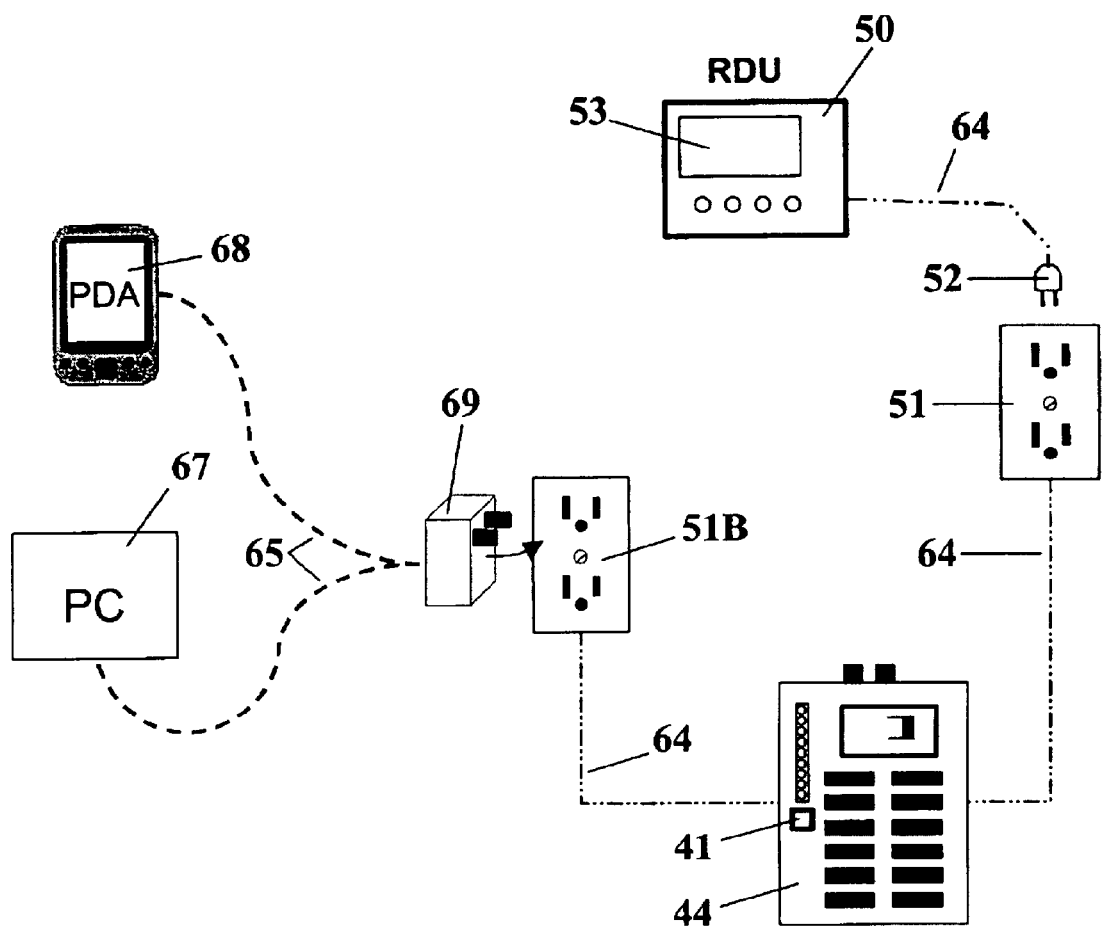
FIG. 12A is a schematic diagram showing an alternate embodiment of a Receiving Display Unit according to the present invention.

The alternate embodiment shown in FIG. 12A includes a PLTC-to-computer interface connector 69 that allows communication between the Receiving Display Unit 50 and the consumer's personal computer 67 or Personal Digital Assistant 68, via Power Line Carrier Technology. Using existing power lines, the PLTC-to-computer interface converter is a special device that plugs in at the consumer's personal computer location and transfers the data via serial, USB, or firewire connection 65 or the like to the consumer's personal computer 67 or Personal Digital Assistant 68, as shown in FIG. 12A. The Measuring Transmitting Unit at the circuit breaker panel 44 transmits data as described herein to the Receiving Display Unit 50, which is plugged into a wall receptacle 51 by a plug 52 on the Receiving Display Unit. The PLTC-to-computer Interface converter 69 is plugged into a second wall receptacle 51B near the personal computer 67 or Personal Digital Assistant 68. Thus, the PLTC-to-computer Interface converter 69 is linked to the personal computer 67 or Personal Digital Assistant 68 by a serial, USB, or firewire connection 65, or the like, and to the Receiving Display Unit 50 50 via power line technology connections 64, thus creating a link between the personal computer/Personal Digital Assistant and the Receiving Display Unit 50 without having to run a cable between the two.

Figure 12B:
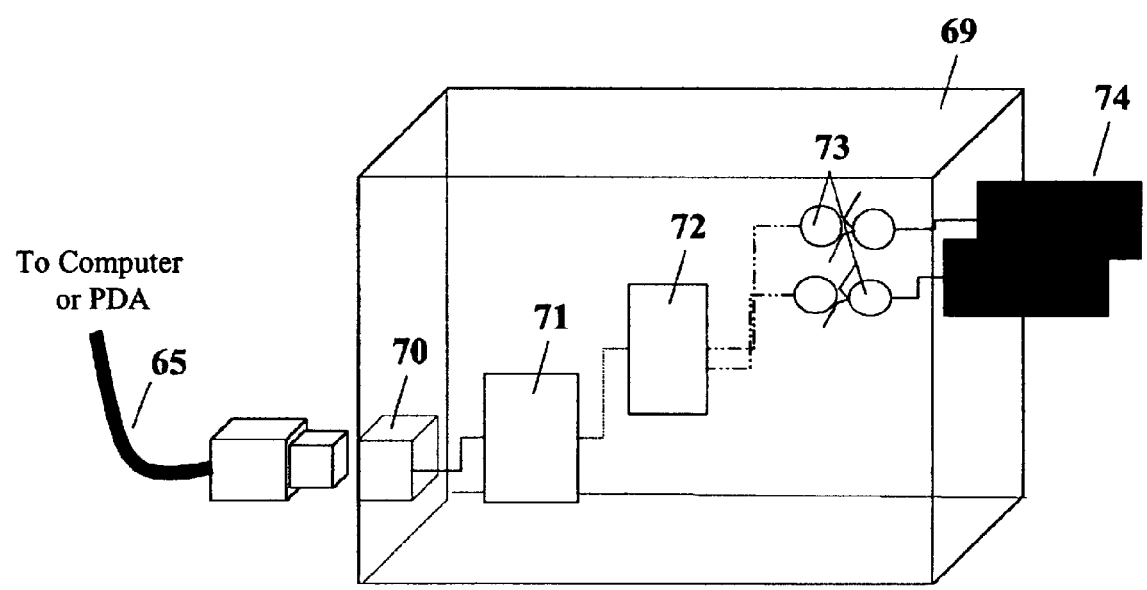
FIG. 12B is a schematic diagram showing an alternate embodiment of a Receiving Display Unit according to the present invention.

The PLTC-to-computer Interface Converter 69 is shown in FIG. 12B. It has a serial, USB, or firewire connector 70 or the like at one end, which is connected to a microprocessor or smart chip 71 within the PLTC-to-computer converter 69. The microprocessor or smart chip 71 is connected to a PLTC chip 72 within the PLTC-to-computer converter 69. The PLTC chip is connected via opto-couplers 73 to a power plug 74 on the opposite face of the PLTC-to-computer Interface Converter 69. The opto-couplers may be an integral part of the PLTC chip.

Figure 13:
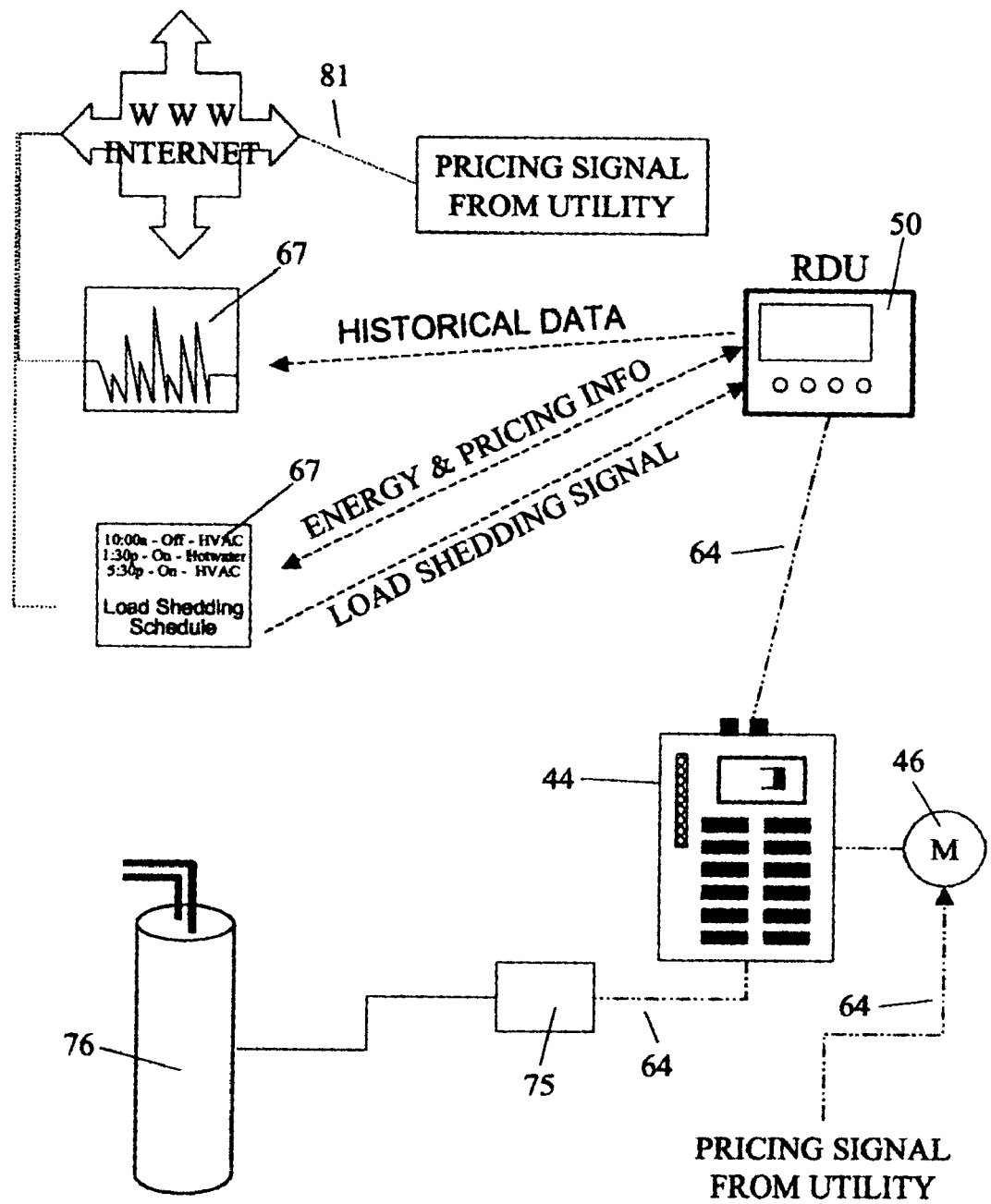
FIG. 13 is a schematic diagram showing operation of a Receiving Display Unit according to the present invention.

The embodiment shown in FIG. 13 includes a Gateway 66 that permits communication between the Receiving Display Unit 50 and the consumer's personal computer 67 or Personal Digital Assistant 68. It allows personal computer scheduling of load shedding and personal computer storage and graphing of historical data received from the Receiving Display Unit. Pricing information is received from the utility through the utility meter 46 or via the Internet or is programmed into the Receiving Display Unit. This information is used in conjunction with the personal computer 67 or Personal Digital Assistant 68 to schedule load shedding via a load shedding device(s) 75. The load shedding device(s) 75 is/are connected to the circuit breaker panel 44 by a power line carrier technology connection 64. The load shedding device(s) 75 is connected to and controls at least one of the electrical appliances 76 in the residence or business. There can be numerous load shedding devices 75 controlling a variety of appliances 76. Thus, a consumer can use his or her personal computer (or PDA) to set up and operate a load shedding schedule for household appliances, such as a water heater, electric furnace, or air conditioner, in order to conserve electricity or schedule use during off peak periods. The consumer can program the load shedding schedule to take advantage of lower utility rates during off-peak periods.

As illustrated in FIG. 13, historical energy-related data from the Receiving Display Unit 50 can be stored and displayed on the personal computer 67 or Personal Digital Assistant 68. For example, the home's history of electricity usage can be displayed through a table, graph, etc. on the personal computer. The consumer can use this information to set parameters for managing electricity usage in the home.

Figure 14:
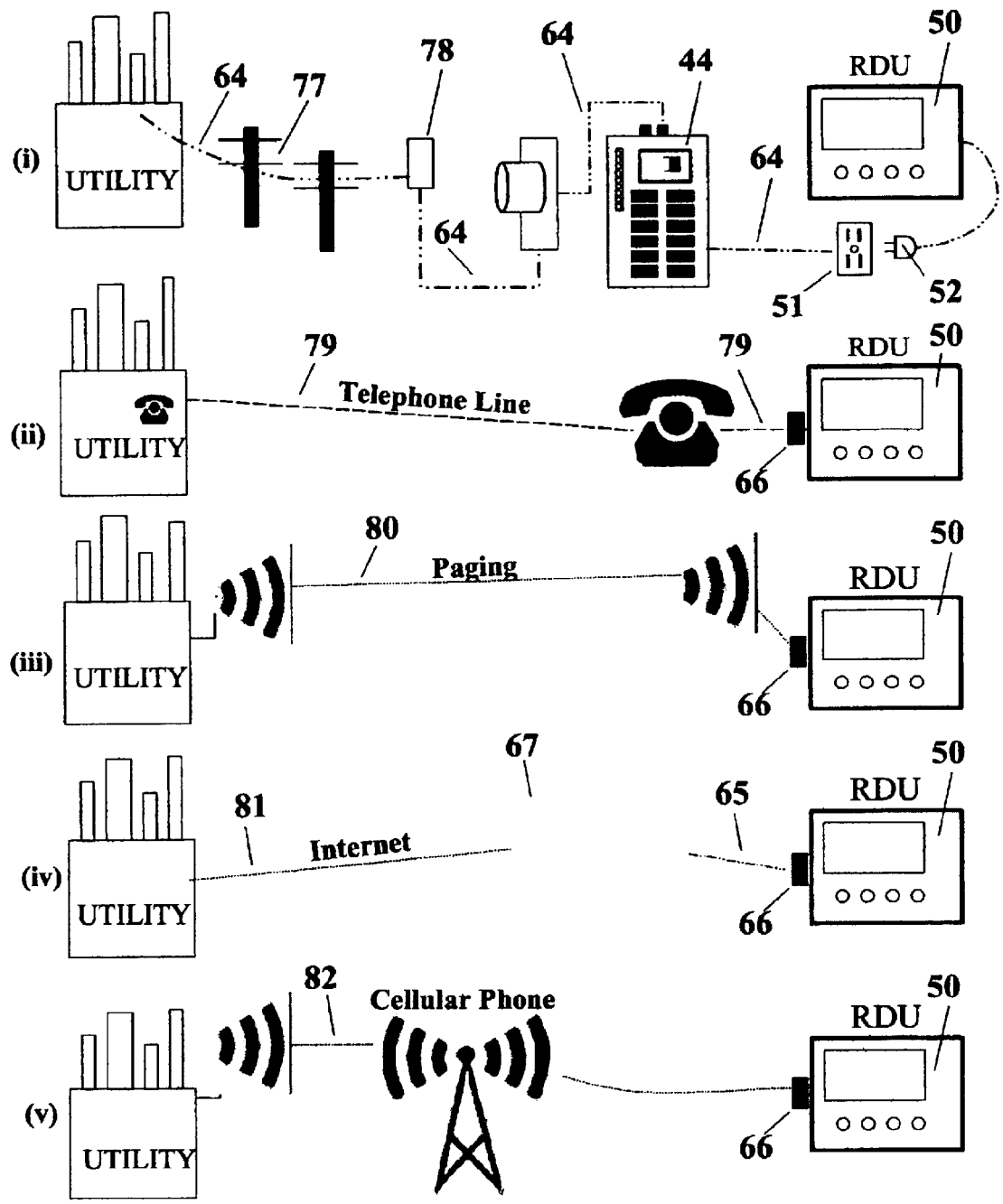
FIG. 14 is a schematic diagram showing various methods of transmitting data to Receiving Display Units according to the present invention.

The embodiments depicted in FIG. 14 allow communication between the Receiving Display Unit 50 and the utility in order to receive rate information, pricing signals, and/or load shedding signals from the utility in a wide range of formats. Suitable means of transmission include the following:

(i) by power line carrier signal from the utility. Here, signals from the utility are transmitted via transmission lines 77 through a transformer 78, the utility meter 46, and the circuit breaker panel 44. The data then travels via power line carrier technology connection 64 to the Receiving Display Unit 50, which is plugged into an AC wall receptacle 51.

(ii) by telephone signal from the utility. In this embodiment, signals are transmitted from the utility through telephone lines 79 to the Gateway 66 located at or in the Receiving Display Unit 50.

(iii) by pager signal 80 from the utility. In this embodiment, the Receiving Display Unit 50 receives via the Gateway 66 signals 80 from the utility.

(iv) by transmission over the Internet 81 from the utility. In this embodiment, information travels from the utility to the user's personal computer 67 via the worldwide web (WWW) Internet 81, and from there via serial, USB, firewire connection 65, or the like, to the Receiving Display Unit 50.

(v) by wireless telephone signal 82 from the utility to the Receiving Display Unit 50, via the Gateway 66 located at or as an integral part of the Receiving Display Unit 50.

By these various methods, a utility can provide up-to-the-minute information to its customers. Individual consumers can respond within minutes to the information by inputting to their Receiving Display Units. For example, a utility informs its customers that it is going to raise rates between 5 and 7 each weeknight. The consumer can respond by load shedding, so that certain appliances, such as a water heater, decrease electricity usage between 5 and 7 PM. Or the consumer may program the personal computer 67, Personal Digital Assistant 68, or Receiving Display Unit 50 50 to automatically respond to pricing signals from the utility. For example, they may load shed the water heater whenever the rate exceeds $0.20 (twenty cents) per KwH.

Figure 15:
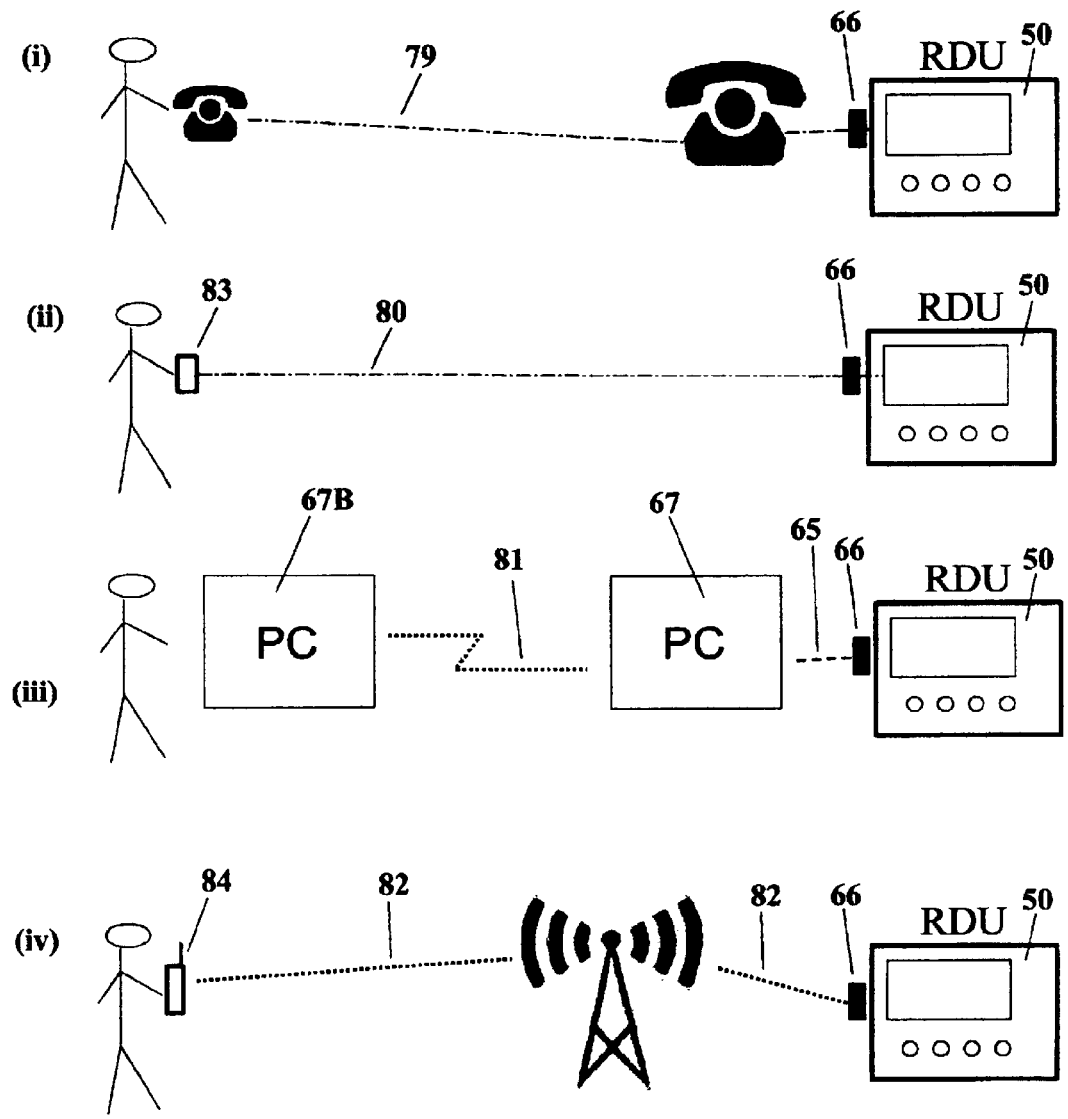
FIG. 15 is a schematic diagram showing methods for receiving information from or inputting data to a Receiving Display Unit according to the present invention.

The embodiments depicted in FIG. 15 allow remote communication between the Receiving Display Unit and the user/consumer at a remote location. This allows the consumer to invoke, cancel, or alter load shedding in a wide range of formats, including the following:
  (i) by telephone signal from the consumer over land telephone lines 79 to the Receiving Display Unit 50 via the Gateway 66 which is near or an integral part of the Receiving Display Unit 50;
  (ii) by pager signal 80 from the consumer's pager 83 to the Receiving Display Unit 50 via the Gateway 66 which is near or an integral part of the Receiving Display Unit 50;
  (iii) by transmission over the Internet 81 from the consumer's personal computer 67B at a remote location to a personal computer 67 connected to the Receiving Display Unit 50 via serial, USB, or firewire connections 65 or the like;
  (iv) by wireless telephone signal 82 from the consumer's cellular phone 84 to the Receiving Display Unit 50 via the Gateway 66 which is near or an integral part of the Receiving Display Unit 50.

This communication is beneficial in that it allows the consumer customized control over his or her household and/or business electricity usage and conservation from the consumer's job site, vacation location, or anywhere the consumer can access a cell phone, telephone, pager, personal computer, etc. This helps the public by decreasing electricity usage at times of high demand, and enables individual consumers to save on their electricity bill. For example, a utility or a Receiving Display Unit can signal a specific cell phone to notify its owner/consumer of a high electricity demand period. The consumer may then direct his or her Receiving Display Unit through his or her cell phone to lower the air conditioner, for example, at home during that period. Or the consumer could page the Receiving Display Unit to turn on the heat prior to arrival time at home.

The present invention also includes a method for monitoring electricity consumption by a residence or business, including the following steps:
  (a) measuring current in main service power conductors, and converting the measurements to digital signals;
  (b) encoding the digital signals and transmitting them over existing power lines in the residence or business using power line carrier technology;
  (c) receiving the encoded digital signals from the power lines, decoding the encoded digital signals, and converting, preferably by performing mathematical operations, the decoded digital signals to power measurements, preferably in kilowatts, kilowatt hours, or currency units;
  (d) periodically receiving signals from a utility;
  (e) storing the measurements and utility signal information in memory; and
  (f) displaying the information for viewing, preferably on a visual display.

Preferably, steps (a) and (b) are conducted in a Measuring Transmitting Unit of a programmable electricity consumption system, and steps (c) through (f) are conducted in a Receiving Display Unit of the system. In step (d), the Receiving Display Unit preferably further comprises an interface for receiving paging signals from a pager, and the signals from the utility are received via the pager. Alternatively, the Receiving Display Unit is linked with a personal computer by a connection through a Receiving Display Unit interface, and the Receiving Display Unit receives data via the Internet on the personal computer. The signals from the utility may be received via a land line telephone or a cellular telephone, or via power line technology connection.

The method preferably further includes the steps of:
  (i) sounding an audio or visual alarm at a pre-set electricity consumption level; and/or
  (ii) load shedding at a pre-set electricity consumption level.

From the foregoing it can be realized that the described device of the present invention may be easily and conveniently utilized as a system which will continuously monitor and display electricity usage in a residence or business. While preferred embodiments of the invention have been described using specific terms, this description is for illustrative purposes only. It will be apparent to those of ordinary skill in the art that various modifications may be made without departing from the spirit or scope of the invention, and that such modifications are intended to be within the scope of the present invention.

BRIEF LIST OF REFERENCE NUMBERS USED IN THE DRAWINGS

10 electricity monitoring system
11 Measuring Transmitting Unit (MTU)
12 Receiving Display Unit (RDU)
13 utility KWH meter
14 outside wall
15 main service power circuit
16 circuit breaker panel
17 main circuit breaker
18 current transformers
19 MTU power wires
20 neutral bus bar
21 individual circuit breakers
22 existing power wiring
23 power plug
24 120 V AC wall receptacle
25 display
26 burden resistors
27 amplifiers
28 MTU microcontroller
29 service size selector switch
30 MTU power supply
31 MTU power line carrier transmission interface controller (transmit)
32 RDU power supply
33 RDU power line carrier transmission interface controller (transmit and receive)
34 data decoder/encoder
35 RDU microcontroller
36 input and mode buttons
37 alarm
38 program and data RAM, PROM, EPROM, and EEPROM memory
40 alternate embodiment of electricity monitoring system
41 MTU
41A MTU add-on unit
42 current sensing modules
43 main circuit breaker
44 circuit breaker panel box
45 main power lines
46 utility meter
47 utility supply
48 neutral bus bar
49 branch circuit breakers 50 RDU
51 wall receptacle
52 plug on RDU
53 display screen on RDU
54 mode buttons on RDU
55 main circuit breaker on-off switch
56 wire to neutral bus
57 incoming main power line cables
58 outgoing main power line cables
59 incoming lugs
60 outgoing lugs
61 voltage probes
62 MTU/utility meter alternate embodiment
63 utility meter base
64 PLTC connection
65 serial, USB, or firewire connection
66 Gateway
67 personal computer
68 Personal Digital Assistant
69 PLTC-to-computer Interface Converter
70 serial, USB, or firewire connector
71 microprocessor or smart chip
72 PLTC chip
73 opto-coupler
74 power plug on PLTC-to-computer interface converter
75 load shedding device
76 electrical appliance
77 transmission line
78 transformer
79 land line telephone lines
80 pager signal
81 Internet signal
82 wireless telephone signal
83 pager
84 cellular phone

What is claimed is:

1. A programmable system for monitoring electricity consumption by a residence or business, the system comprising:
   (a) a Measuring Transmitting Unit integrated in a main circuit breaker or utility meter in the residence or business; comprising: (1) a means of receiving AC analog signals, converting the AC analog signals to DC analog signals, summing the DC analog signals, and outputting the information; (2) a microcontroller; (3) a power line carrier transmission interface controller; and (4) a power supply for powering the Measuring Transmitting Unit; and
   (b) a programmable Receiving Display Unit, comprising: (1) a power supply for powering the Receiving Display Unit; (2) a power plug; (3) a power line carrier transmission interface controller; (4) a data decoder; (5) a microcontroller; (6) memory associated with the microcontroller; (7) a visual display; and (8) a mechanism for inputting to the Receiving Display Unit; and
   wherein the Measuring Transmitting Unit translates current flowing in main service power circuit conductors to digitally encoded signals, and transmits the digitally encoded signals over existing power circuits in the residence or business; and the Receiving Display Unit receives the digitally encoded signals being emitted by the Measuring Transmitting Unit, decodes the digitally encoded signals, and translates them to the visual display for viewing; which system is not connected to a current transformer.

2. The system according to claim 1, wherein the means of receiving AC analog signals, converting the AC analog signals to DC analog signals, summing the DC analog signals, and outputting the information, is at least two amplifiers.

3. The system according to claim 2, wherein the Measuring Transmitting Unit further comprises two or three burden resistors for converting a current signal to a voltage signal.

4. A programmable system for monitoring electricity consumption by a residence or business, the system comprising:
   (a) a Measuring Transmitting Unit integrated in a main circuit breaker or utility meter in the residence or business; comprising: (1) a means of receiving AC analog signals, converting the AC analog signals to DC analog signals, summing the DC analog signals, and outputting the information; (2) a microcontroller; (3) a power line carrier transmission interface controller; and (4) a power supply for powering the Measuring Transmitting Unit; and
   (b) a programmable Receiving Display Unit, comprising: (1) a power supply for powering the Receiving Display Unit; (2) a power plug; (3) a power line carrier transmission interface controller; (4) a data decoder; (5) a microcontroller; (6) memory associated with the microcontroller; (7) a visual display; and (8) a mechanism for inputting to the Receiving Display Unit; and
   wherein the Measuring Transmitting Unit translates current flowing in main service power circuit conductors to digitally encoded signals, and transmits the digitally encoded signals over existing power circuits in the residence or business; the Receiving Display Unit receives the digitally encoded signals being emitted by the Measuring Transmitting Unit, decodes the digitally encoded signals, and translates them to the visual display for viewing; and the Measuring Transmitting Unit and at least two current sensing modules are an integral part of a main circuit breaker unit within the circuit breaker panel.

5. The system according to claim 4, wherein the main circuit breaker unit comprises an on-off switch, and a voltage sensing and transmitting Measuring Transmitting Unit linked to the at least two current sensing modules within the main circuit breaker unit.

6. The system according to claim 4, wherein the mechanism for inputting to the Receiving Display Unit is at least one input or mode button on a face of the Receiving Display Unit.

7. The system according to claim 4, wherein the Receiving Display Unit is linked to a Personal Digital Assistant through a power line technology connection (PLTC)-to-computer Interface converter; the PLTC-to-computer interface converter being linked to the Personal Digital Assistant by a serial, USB, or firewire connection; the PLTC-to-computer interface converter being plugged into a second AC receptacle; the Receiving Display Unit being linked by a power line technology connection to the PLTC-to-computer Interface converter.

8. The system according to claim 7, wherein the PLTC-to-computer interface converter comprises a serial, USB, or firewire connector connected to a microprocessor; the microprocessor being connected to a power line technology connection chip; the power line technology connection chip being linked to a power plug on an opposite face of the PLTC-to-computer interface converter.

9. The system according to claim 8, wherein the power line technology connection (PLTC)-to-computer interface converter comprises a serial, USB, or firewire connector connected to a smart chip; the smart chip being connected to a power line technology connection chip; the power line technology connection chip being connected to a power plug on the PLTC-to-computer interface converter.

10. The system according to claim 4, wherein the Receiving Display Unit is linked to a land telephone line for automatic reception of information via a telephone.

11. The system according to claim 4, wherein the Receiving Display Unit further comprises an interface for receiving wireless telephone transmissions.

12. The system according to claim 4, wherein the Receiving Display Unit further comprises an interface for receiving paging signals from a pager.

13. A programmable system for monitoring electricity consumption by a residence or business, the system comprising:
   (a) a Measuring Transmitting Unit integrated in a main circuit breaker, breaker panel, or utility meter in the residence or business; comprising: (1) a means of receiving AC analog signals, converting the AC analog signals to DC analog signals, summing the DC analog signals, and outputting the information; (2) a microcontroller; (3) a power line carrier transmission interface controller; and (4) a power supply for powering the Measuring Transmitting Unit; and
   (b) a programmable Receiving Display Unit, comprising: (1) a power supply for powering the Receiving Display Unit; (2) a power plug; (3) a power line carrier transmission interface controller; (4) a data decoder; (5) a microcontroller; (6) memory associated with the microcontroller; (7) a visual display; and (8) a mechanism for inputting to the Receiving Display Unit; and
   wherein the Measuring Transmitting Unit translates current flowing in main service power circuit conductors to digitally encoded signals, and transmits the digitally encoded signals over existing power circuits in the residence or business; and the Receiving Display Unit receives the digitally encoded signals being emitted by the Measuring Transmitting Unit, decodes the digitally encoded signals, and translates them to the visual display for viewing; and the Receiving Display Unit is linked with a personal computer by a connection through a Receiving Display Unit interface.

14. The system according to claim 13, wherein the Receiving Display Unit further comprises a digital clock with battery back-up, and a protective cover for enclosing the Receiving Display Unit.

15. The system according to claim 14, wherein data is received from the utility via existing transmission lines through the utility meter of the residence or business; the data passing via power line technology connection to the Receiving Display Unit.

16. The system according to claim 13, wherein the Receiving Display Unit is linkable by a power line technology connection to at least one load shedding device; the at least one load shedding device controlling at least one electrical appliance in the residence or business.

17. The system according to claim 16, wherein the Receiving Display Unit is linked to a Personal Digital Assistant by a serial, USB, or firewire connection.

18. The system according to claim 13, wherein the Receiving Display Unit receives data via the Internet on the personal computer.

19. A programmable system for monitoring electricity consumption by a residence or business, the system comprising:
   (a) a Measuring Transmitting Unit integrated in a main circuit breaker or utility meter in the residence or business; comprising: (1) a means of receiving AC analog signals, converting the AC analog signals to DC analog signals, summing the DC analog signals, and outputting the information; (2) a microcontroller; (3) a power line carrier transmission interface controller; and (4) a power supply for powering the Measuring Transmitting Unit; and
   (b) a programmable Receiving Display Unit, comprising: (1) a power supply for powering the Receiving Display Unit; (2) a power plug; (3) a power line carrier transmission interface controller; (4) a data decoder; (5) a microcontroller; (6), memory associated with the microcontroller; (7) a visual display; and (8) a mechanism for inputting to the Receiving Display Unit; and
   wherein the Measuring Transmitting Unit translates current flowing in main service power circuit conductors to digitally encoded signals, and transmits the digitally encoded signals over existing power circuits in the residence or business; the Receiving Display Unit receives the digitally encoded signals being emitted by the Measuring Transmitting Unit, decodes the digitally encoded signals, and translates them to the visual display for viewing; and the Receiving Display Unit is connected to a Personal Digital Assistant through a serial, USB, or firewire connection.

20. The system according to claim 19, wherein the Receiving Display Unit comprises RAM or EEPROM memory for manipulating and storing data, and PROM or EPROM memory for storing a software program.

21. The system according to claim 20, wherein the Receiving Display Unit further comprises a means for transmitting coded signals back through the power circuits in the residence or business for information transmission and load shedding.

22. The system according to claim 21, wherein the visual display is a liquid crystal display.

23. The system according to claim 22, wherein the Receiving Display Unit further comprises a visual or audible alarm, and wherein the liquid crystal display is lighted.

24. The system according to claim 23, wherein the power plug transmits electrical power for the power supply of the Receiving Display Unit, as well as a reference signal for timing power line carrier transmissions.

25. The system according to claim 19, wherein the Receiving Display Unit is linked to a personal computer through a power line technology connection (PLTC)-to-computer interface converter; the PLTC-to-computer interface converter being linked to the personal computer; the PLTC-to-computer interface converter being plugged into a second AC receptacle; the Receiving Display Unit being linked by a power line carrier technology connection to the PLTC-to-computer Interface converter.

26. A programmable system for monitoring electricity consumption by a residence or business, the system comprising:
   (a) a Measuring Transmitting Unit integrated in a main circuit breaker, breaker panel, or utility meter in the residence or business; comprising: (1) a means of receiving AC analog signals, converting the AC analog signals to DC analog signals, summing the DC analog signals, and outputting the information; (2) a microcontroller; (3) a power line carrier transmission interface controller; and (4) a power supply for powering the Measuring Transmitting Unit; and
   (b) a programmable Receiving Display Unit, comprising: (1) a power supply for powering the Receiving Display Unit; (2) a power plug; (3) a power line carrier transmission interface controller; (4) a data decoder; (5) a microcontroller; (6) memory associated with the microcontroller; (7) a visual display; and (8) a mechanism for inputting to the Receiving Display Unit; and wherein the Measuring Transmitting Unit translates current flowing in main service power circuit conductors to digitally encoded signals, and transmits the digitally encoded signals over existing power circuits in the residence or business; the Receiving Display Unit receives the digitally encoded signals being emitted by the Measuring Transmitting Unit, decodes the digitally encoded signals, and translates them to the visual display for viewing; the Receiving Display Unit is linkable by a power line technology connection to at least one load shedding device; the at least one load shedding device controlling at least one electrical appliance in the residence or business; and the Receiving Display Unit is linked to a personal computer through a Receiving Display Unit interface by a serial, USB, or firewire connection.

27. A method for monitoring electricity consumption by a residence or business, the method comprising the following steps:

(a) measuring current in main service power conductors, and converting the measurements to digital signals;

(b) encoding the digital signals and transmitting them over existing power lines in the residence or business using power line carrier technology;

(c) receiving the encoded digital signals from the power lines, decoding the encoded digital signals, and converting the decoded digital signals to power measurements;

(d) periodically receiving signals from a utility;

(e) storing the measurements and utility signal information in memory; and (f) displaying the information for viewing.

28. The method according to claim 27, further comprising the step of sounding an audio or visual alarm at a pre-set electricity consumption level.

29. The method according to claim 27, further comprising the step of load shedding at a pre-set electricity consumption level.

30. The method according to 27, wherein steps (a) and (b) are conducted in a Measuring Transmitting Unit of a programmable electricity consumption system, and steps (c) through (f) are conducted in a Receiving Display Unit of the system.

31. The method according to claim 30, wherein, in step (d), the Receiving Display Unit further comprises an interface for receiving paging signals from a pager, and the signals from the utility are received via the pager.

32. The method according to claim 30, wherein the Receiving Display Unit is linked with a personal computer by a connection through a Receiving Display Unit interface, and the Receiving Display Unit receives data via the Internet on the personal computer.

33. The method according to claim 27 wherein the signals from the utility are via a land line telephone or a cellular telephone.

34. The method according to claim 27, wherein the signals from the utility are received via power line technology connection.

* * * * *